(12) United States Patent
Jinbo et al.

(10) Patent No.: US 7,968,382 B2
(45) Date of Patent: Jun. 28, 2011

(54) METHOD OF MANUFACTURING SEMICONDUCTOR DEVICE

(75) Inventors: Yasuhiro Jinbo, Kanagawa (JP); Toshiyuki Isa, Kanagawa (JP); Tatsuya Honda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 286 days.

(21) Appl. No.: 12/019,361

(22) Filed: Jan. 24, 2008

(65) Prior Publication Data

US 2009/0004772 A1   Jan. 1, 2009

(30) Foreign Application Priority Data

Feb. 2, 2007 (JP) ................. 2007-023747

(51) Int. Cl.
- *H01L 21/00* (2006.01)
- *H01L 21/84* (2006.01)
- *H01L 51/40* (2006.01)

(52) U.S. Cl. ............... 438/149; 438/99; 257/E51.005; 257/E21.57

(58) Field of Classification Search ............ 438/99, 438/149, 685
See application file for complete search history.

(56) References Cited

U.S. PATENT DOCUMENTS

| | | | |
|---|---|---|---|
| 5,757,456 A | 5/1998 | Yamazaki et al. | |
| 5,821,138 A | 10/1998 | Yamazaki et al. | |
| 6,127,199 A | 10/2000 | Inoue et al. | |
| 6,372,608 B1 | 4/2002 | Shimoda et al. | |
| 6,645,830 B2 | 11/2003 | Shimoda et al. | |
| 6,818,530 B2 | 11/2004 | Shimoda et al. | |
| 7,084,045 B2 | 8/2006 | Takayama et al. | |
| 7,094,665 B2 | 8/2006 | Shimoda et al. | |
| 7,147,740 B2 | 12/2006 | Takayama et al. | |
| 7,341,924 B2 | 3/2008 | Takayama et al. | |
| 2002/0098628 A1* | 7/2002 | Hamada et al. | 438/149 |
| 2003/0032210 A1 | 2/2003 | Takayama et al. | |
| 2003/0217805 A1* | 11/2003 | Takayama et al. | 156/249 |
| 2004/0023447 A1* | 2/2004 | Hirakata et al. | 438/149 |
| 2005/0167573 A1* | 8/2005 | Maruyama et al. | 250/214.1 |
| 2006/0030122 A1 | 2/2006 | Shimoda et al. | |
| 2006/0134918 A1* | 6/2006 | Fujii et al. | 438/694 |
| 2006/0275960 A1* | 12/2006 | Yamada et al. | 438/149 |
| 2007/0010067 A1 | 1/2007 | Shimoda et al. | |
| 2007/0054436 A1 | 3/2007 | Hirakata et al. | |
| 2007/0254456 A1 | 11/2007 | Maruyama et al. | |

FOREIGN PATENT DOCUMENTS

| | | |
|---|---|---|
| EP | 1 351 308 A1 | 10/2003 |
| EP | 0 858 110 B1 | 12/2006 |
| JP | 08-250745 | 9/1996 |
| JP | 08-250745 A | 9/1996 |
| JP | 08-288522 | 11/1996 |
| JP | 2003-174153 | 6/2003 |

* cited by examiner

*Primary Examiner* — Savitri Mulpuri
*Assistant Examiner* — Calvin Choi
(74) *Attorney, Agent, or Firm* — Fish & Richardson P.C.

(57) ABSTRACT

An object of the invention is to provide a method for manufacturing semiconductor devices that are flexible in which elements fabricated using a comparatively low-temperature (less than 500° C.) process are separated from a substrate. After a molybdenum film is formed over a glass substrate, a molybdenum oxide film is formed over the molybdenum film, a nonmetal inorganic film and an organic compound film are stacked over the molybdenum oxide film, and elements fabricated by a comparatively low-temperature (less than 500° C.) process are formed using existing manufacturing equipment for large glass substrates, the elements are separated from the glass substrate.

28 Claims, 17 Drawing Sheets

METHOD OF MANUFACTURING SEMICONDUCTOR DEVICE

BACKGROUND OF THE INVENTION

1. Field of the Invention

The present invention relates to a method of manufacturing semiconductor devices including thin film transistors, light-emitting elements, passive elements, and the like. Furthermore, the present invention relates to electro-optical devices represented by liquid crystal display panels, light-emitting display devices that have light-emitting elements, and electronic devices in which IC tags, by which information can be transmitted and received wirelessly, are mounted as components.

It is to be noted that "semiconductor device" in the present specification refers to a general device that can function as a semiconductor device using semiconductor characteristics, and electro-optical devices, light-emitting devices, semiconductor circuits, IC tags, and electronic devices can all be considered semiconductor devices.

2. Description of the Related Art

In recent years, technology that is used to form thin film transistors using semiconductor thin films (with thicknesses of from several nanometers to several hundreds of nanometers, approximately) that are formed over substrates that have an insulating surface has been attracting attention. Thin film transistors are applied to a wide range of electronic devices like ICs and electro-optical devices, and prompt development of thin film transistors that are to be used as switching elements in image display devices, in particular, is being pushed.

With applications that use these kinds of image display devices, a variety of things are being expected, and use in portable devices, in particular, is attracting attention. Glass substrates and quartz substrates are often used in image display devices; however, there are disadvantages to using glass substrates and quartz substrates in that they are easily breakable as well as heavy. Furthermore, increasing the size of glass substrates and quartz substrates, such as for mass production, is difficult, and glass substrates and quartz substrates are thus not suitable for mass production. For these reasons, forming thin film transistors over flexible substrates, typically, flexible plastic films, is being attempted.

Thus, technology in which semiconductor elements, including thin film transistors, that are formed over glass substrates are separated from the glass substrates and transferred to other substrates, for example, to plastic films or the like, has been proposed.

The present applicant proposed the separation and transfer technique that is disclosed in Patent Reference Document 1 and Patent Reference Document 2. In Patent Reference Document 1, a separation technique by which a silicon oxide film that is to be used as a peeling layer is removed by wet etching is disclosed. In addition, in Patent Reference Document 2, a separation technique by which a silicon film that is to be used as a peeling layer is removed by dry etching is disclosed.

Furthermore, the present applicant proposed the separation and transfer technique that is disclosed in Patent Reference Document 3. In Patent Reference Document 3, a technique where a metal (Ti, Al, Ta, W, Mo, Cu, Cr, Nd, Fe, Ni, Co, Ru, Rh, Pd, Os, or Ir) layer is formed over a substrate, an oxide layer is formed and stacked thereover, a metal oxide layer of the metal layer is formed in the interface between the metal layer and the oxide layer, and separation from the substrate is performed during a subsequent step using this metal oxide layer is disclosed.

Patent Reference Document 1: Japanese Published Patent Application No. H8-288522
Patent Reference Document 2: Japanese Published Patent Application No. H8-250745
Patent Reference Document 3: Japanese Published Patent Application No. 2003-174153

SUMMARY OF THE INVENTION

In the present invention, a separation and transfer technique by which elements, typically, thin film transistors formed using amorphous semiconductor films, crystalline semiconductor films that are formed by laser crystallization, or the like; thin film transistors formed using organic semiconductor films; light-emitting elements; passive elements (sensor elements, antennas, resistive elements, capacitive elements, and the like); and the like, which are fabricated by a comparatively low-temperature (temperature of less than 500° C.) process, are separated from glass substrates and transferred to flexible substrates (typically, plastic films) is disclosed.

The thin film transistors formed using amorphous semiconductor films or the like and the thin film transistors formed using organic semiconductor films can be directly formed over the plastic films; however, because plastic films are soft and curl up easily, there is a need to set the manufacturing equipment to be manufacturing equipment that is used to handle plastic films exclusively.

Furthermore, when thin film transistors formed using amorphous semiconductor films or the like and thin film transistors formed using organic semiconductor films are directly formed over plastic films, there is a risk that the plastic films will be exposed to solvents or etching gases that are used in the course of the thin film transistor fabrication process and that the quality of the plastic films themselves will change because of this exposure. In addition, when thin film transistors formed using ZnO are directly formed over plastic films, if the plastic films are irradiated by plasmas that are generated by a sputtering method or the like, the plastic films themselves will become deformed. Moreover, there is a possibility that moisture or the like will be absorbed into the plastic films in the course of the thin film transistor fabrication process or that the elements will be contaminated by emission. Additionally, because heat resistance is lower and the degree of heat-induced expansion and contraction higher for plastic films than for glass substrates, carefully controlling the process temperature of each step of the fabrication process is difficult.

Moreover, when mass production of semiconductor devices formed using plastic films is carried out, it is often the case that manufacturing equipment is supplied with a roll-to-roll method. However, with a roll-to-roll method, existing semiconductor manufacturing equipment cannot be used. In addition, the level of accuracy for alignment is low, and microfabrication is difficult. As a result, fabrication of semiconductor devices, in which characteristics equivalent to those of conventional semiconductor devices formed using glass substrates are obtained, at high yield is difficult.

An object of the present invention is the provision of a manufacturing method for semiconductor devices that are thin and that have elements, typically, thin film transistors formed using amorphous semiconductor films or the like; thin film transistors formed using crystalline semiconductor films crystallized by laser crystallization; thin film transistors formed using organic semiconductor films; light-emitting elements; passive elements (sensor elements, antennas, resistive elements, capacitive elements, and the like); and the like, that are fabricated at a comparatively low temperature, typically, a temperature that can be withstood by an organic compound. Furthermore, another object of the present invention is the provision of a manufacturing method for semiconductor devices that are flexible.

In accordance with a feature of the present invention, a method of manufacturing a semiconductor device comprises the steps of forming a metal film (preferably, a molybdenum film) over a substrate, forming a metal oxide film (preferably, a molybdenum oxide film) over the metal film, forming a nonmetal inorganic film over the metal oxide film, forming an organic compound film over the nonmetal inorganic film, forming a semiconductor element over the organic compound film, and separating the semiconductor element from the substrate. The metal oxide film may be an oxide film of a same metal as a metal of the metal film. In accordance with another feature of the present invention, a method of manufacturing a semiconductor device comprises the steps of forming a metal film (preferably, a molybdenum film) over a substrate, forming a metal oxide film (preferably, a molybdenum oxide film) over the metal film, forming a nonmetal inorganic film over the metal oxide film, forming an organic compound film over the nonmetal inorganic film, forming a conductive layer over the organic compound film, and separating the conductive layer from the substrate. The metal oxide film may be an oxide film of a same metal as a metal of the metal film. In accordance with still another feature of the present invention, elements are separated from a glass substrate after completion of steps in which a molybdenum film (Mo film) is formed over a glass substrate and a molybdenum oxide film is formed over the molybdenum film; a nonmetal inorganic film and an organic compound film are stacked over the molybdenum oxide film; elements (typically, thin film transistors formed using amorphous semiconductor films, crystalline semiconductor films that are formed by laser crystallization, or the like; thin film transistors formed using organic semiconductor films; light-emitting elements; passive elements (sensor elements, antennas, resistive elements, capacitive elements, and the like); and the like) fabricated by a process at a comparatively low temperature, typically, a temperature that can be withstood by the organic compound film, are formed over the organic compound film. There is a disadvantage with using molybdenum in that the heat resistance of molybdenum is low compared to that of tungsten. For example, because separation occurs with molybdenum films if heat treatment at a temperature of 500° C. or more is performed thereon, it is preferable that the temperature of the fabrication process involving molybdenum films be set to less than 500° C. Molybdenum oxide films are also brittle. In the present invention, separation of elements from a substrate is performed in the vicinity of a molybdenum oxide film that has this brittleness. Typically, by a stacked-layer structure of a molybdenum film, a molybdenum oxide film, and a nonmetal inorganic film, separation of elements from a substrate can be performed in the vicinity of the molybdenum oxide film that has brittleness, and separation of elements from a substrate can be performed at high yield even if comparatively large substrates are used.

In addition, in separating elements (light-emitting elements, organic thin film transistors, and the like), each containing an organic compound, that are formed over a molybdenum oxide film that is provided over a glass substrate from the glass substrate, because the adhesiveness of an organic compound layer contained in each of the light-emitting elements, organic thin film transistors, and the like is weak, separation of the elements from the glass substrate occurs not in the vicinity of a metal layer but within the organic compound layer or at an interface of the organic compound layer, and there is a possibility of the elements that each contain an organic compound breaking. Furthermore, because the adhesiveness of a material layer formed by a printing method is weak, there is a possibility that separation of the elements from the glass substrate will occur, as with the above, either within the material layer or at an interface of the material layer. However, if the separation method of the present invention that uses a molybdenum oxide film is used, because a molybdenum oxide film is brittle, separation of elements from a substrate can be performed with relatively little force. Moreover, because there is no need, in particular, for heat treatment on or irradiation by laser beam of the entire substrate in order to separate the elements from the substrate, the process is simplified.

Furthermore, molybdenum has advantages over other metal elements in that vapor pressure is low and there is little emission of gases. Consequently, contamination of elements that are formed over a molybdenum film can be suppressed to a minimal amount.

It is to be noted that the molybdenum film is to be formed over a glass substrate; however, the substrate that is used is not limited to being a glass substrate, and a quartz substrate, a ceramic substrate, a semiconductor substrate, or the like can be used, as well. Furthermore, the molybdenum oxide film is to be formed over the molybdenum film; however, the molybdenum oxide film may be formed in contact with the molybdenum film.

In the present invention, after elements, such as thin film transistors and the like, are formed using existing manufacturing equipment for large glass substrates, the elements are separated from the glass substrate over which they are formed. Consequently, because existing manufacturing equipment is used, equipment costs can be significantly reduced.

In addition, by formation of an organic compound film at a thickness of 5 μm or more, preferably, at a thickness of greater than or equal to 10 μm and less than or equal to 100 μm, between a nonmetal inorganic film, which comes into contact with a molybdenum oxide film, and a semiconductor element, the organic compound film can be made to function as a support of a semiconductor device that is formed after the organic compound film is formed. Moreover, by heat treatment performed during fabrication of the organic compound film, separation of elements from the substrate, which is to be performed during a subsequent step, in the vicinity of the molybdenum oxide film becomes easy to do.

One configuration of the invention disclosed in the present specification is that of a manufacturing method by which semiconductor elements are formed over a flexible substrate, where, after a molybdenum film is formed over a substrate, a molybdenum oxide film is formed over the molybdenum film, a nonmetal inorganic film is formed over the molybdenum oxide film, an organic compound film is formed over the nonmetal inorganic film, an amorphous semiconductor film is formed over the organic compound film, and semiconductor elements are formed using the amorphous semiconductor film, a stacked-layer body that includes the nonmetal inorganic film, the organic compound film, and the semiconductor elements is separated from the substrate.

The present invention is an invention in which, after semiconductor elements, which are not formed of material layers that are stacked in order over a flexible substrate but are formed using an amorphous silicon film that is formed over a glass substrate, a ceramic substrate, or a quartz substrate, are formed, the semiconductor elements are separated from the glass substrate, ceramic substrate, or quartz substrate over which they are formed. It is to be noted that the semiconductor elements may be separated from the substrate after being affixed to a flexible substrate that is on a side opposite from the substrate with the semiconductor elements interposed between the flexible substrate and the substrate. Furthermore, elements may be interposed between and affixed to two flexible substrates, as well.

In addition, another configuration of the invention disclosed in the present specification is that of a manufacturing method by which elements such as organic thin film transistors are formed over a flexible substrate, where, after a molybdenum film is formed over a substrate, a molybdenum oxide film is formed over the molybdenum film, a nonmetal inorganic film is formed over the molybdenum oxide film, an organic compound film is formed over the nonmetal inorganic film, an semiconductor film that contains an organic compound is formed over the organic compound film, and semiconductor elements are formed using the semiconductor film that contains an organic compound, a stacked-layer body that includes the nonmetal inorganic film, the organic compound film, and the semiconductor elements is separated from the substrate.

Furthermore, another configuration of the invention disclosed in the present specification is that of a manufacturing method by which light-emitting elements such as organic light-emitting elements, inorganic light-emitting elements, and the like are formed over a flexible substrate, where, after a molybdenum film is formed over a substrate, a molybdenum oxide film is formed over the molybdenum film, a nonmetal inorganic film is formed over the molybdenum oxide film, an organic compound film is formed over the nonmetal inorganic film, a first electrode is formed over the organic compound film, a light-emitting layer that contains an organic compound or an inorganic compound is formed over the first electrode, a second electrode is formed over the light-emitting layer, and a flexible substrate is attached to the second electrode, a stacked-layer body that includes the nonmetal inorganic film, the organic compound film, the first electrode, the light-emitting layer, and the second electrode is separated from the substrate.

Yet another configuration of the invention disclosed in the present specification is that of a manufacturing method by which passive elements such as antennas and the like are formed over a flexible substrate, where, after a molybdenum film is formed over a substrate, a molybdenum oxide film is formed over the molybdenum film, a nonmetal inorganic film is formed over the molybdenum oxide film, an organic compound film is formed over the nonmetal inorganic film, a conductive layer is printed over the organic compound film by a printing method, the conductive layer is baked, and the conductive layer and semiconductor components are attached to each other, the nonmetal inorganic film, the organic compound film, the conductive film, and the semiconductor components are separated from the substrate.

Yet another configuration of the invention disclosed in the present specification is one in which, after a molybdenum film is formed over a substrate; a molybdenum oxide film is formed over the molybdenum film; a nonmetal inorganic film is formed over the molybdenum oxide film; an organic compound film is formed over the nonmetal inorganic film; a conductive layer is printed over the organic compound film by a printing method; the conductive layer is baked; and a stacked-layer body that includes the nonmetal inorganic film, the organic compound film, and the conductive layer are separated from the substrate, semiconductor components are connected to the conductive layer.

Furthermore, in each of the above configurations, a pretreatment step may be performed in order to facilitate the separation of elements from a substrate, and it is preferable that, for example, a part of the substrate be irradiated with a laser beam before the elements are separated from the substrate. Specifically, irradiation with a relatively weak laser beam (the irradiation energy of the laser source is from 1 mJ to 2 mJ) may be performed using a solid-state laser (a pulse-excitation Q-switched Nd:YAG laser) using the second harmonic (wavelength of 532 nm) or third harmonic (wavelength of 355 nm) of a fundamental wave. In addition, a notch may be inserted at the place where separation is to be performed by use of a sharp object, as well.

Moreover, in relation to thin film transistors, the present invention can be applied to any thin film transistor regardless of element structure, and, for example, top-gate thin film transistors, bottom-gate (inverted-staggered) thin film transistors, and staggered thin film transistors can be used. In addition, the transistors used are not limited to being transistors that have a single-gate structure but may be set to be multi-gate transistors that have a plurality of channel formation regions, for example, double-gate transistors.

Furthermore, by the present invention, display devices that are flexible, thin, and large can be manufactured, and these display devices are not limited to being passive matrix liquid crystal display devices or passive matrix light-emitting devices; active matrix liquid crystal display devices and active matrix light-emitting devices can be manufactured, as well.

It is to be noted that, in the present specification, "molybdenum film" refers to a film whose main component is molybdenum, and there are no particular limitations on the molybdenum film as long as it is one in which the percent composition of molybdenum is 50% or more, and the molybdenum film may be doped with Co, Sn, or the like to increase the mechanical strength of the film. Furthermore, the film may be made to contain nitrogen in order to reduce its brittleness.

Additionally, "flexible substrate" refers to a plastic substrate that is formed as a film, for example, a plastic substrate made from polyethylene terephthalate (PET), polyethersulfone (PES), polyethylene naphthalate (PEN), polycarbonate (PC), nylon, polyetheretherketone (PEEK), polysulfone (PSU), polyetherimide (PEI), polyarylate (PAR), polybutylene terephthalate (PBT), or the like.

By the present invention, a separation process can be performed smoothly, even if a substrate with a large area, where the length of the diagonal of the substrate exceeds 1 meter, is used. In addition, by provision of an organic compound film between a molybdenum oxide film and semiconductor elements, the organic compound film can be made to function as a support for the semiconductor device. For this reason, a support substrate used to support the semiconductor device need not be formed unnecessarily, and costs can be reduced.

DETAILED DESCRIPTION OF THE INVENTION

Figure 1A:
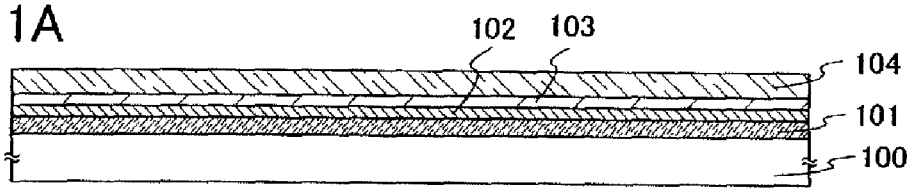
FIGS. 1A to 1E are cross-sectional-view diagrams used to describe a manufacturing method for a semiconductor device of the present invention.

Hereinafter, Embodiment Modes of the present invention will be described based on diagrams. However, the present invention can be implemented in a lot of different modes, and it is to be easily understood by those skilled in the art that various changes and modifications can be made without any departure from the spirit and scope of the present invention. Accordingly, the present invention is not to be taken as being limited to the described content of the embodiment modes included herein. It is to be noted that identical portions or portions having similar functions in all figures used to describe embodiment modes are denoted by the same reference numerals, and repetitive description thereof is omitted.

Embodiment Mode 1

Here, an example in which a liquid crystal display device is fabricated will be described using FIGS. 1A to 1E.

A molybdenum film 101 is formed over a substrate 100. A glass substrate is used for the substrate 100. Furthermore, for the molybdenum film 101, a molybdenum film with a thickness of from 30 nm to 200 nm obtained by a sputtering method is used. It is to be noted that, because there are cases where the substrate is locked in place in a sputtering method, the film thickness of the molybdenum film in the vicinity of the edges of the substrate easily becomes uneven. For this reason, it is preferable that the edges of the molybdenum film be removed by dry etching.

Next, a molybdenum oxide film 102 is formed over the molybdenum film 101. The molybdenum oxide film 102 can be formed by an evaporation method. Alternatively, the molybdenum oxide film 102 may be formed in contact with the molybdenum film 101; the surface of the molybdenum film 101 may be oxidized, and the molybdenum oxide film 102 may be formed thereby. For a formation method for the molybdenum oxide film 102, the molybdenum oxide film 102 may be formed by oxidation of the surface of the molybdenum film 101 using pure water or ozone water or by oxidation by oxygen plasma or dinitrogen oxide plasma. Furthermore, the molybdenum oxide film 102 may be formed by application of heat in an atmosphere that contains oxygen.

Next, a nonmetal inorganic film 103 is formed over the molybdenum oxide film 102. The nonmetal inorganic film 103 is a film that is formed of an inorganic compound or a simple substance other than an elemental metal. For inorganic compounds, there are metal oxides, metal nitrides, metal oxynitrides, and the like. Typically, there is silicon nitride oxide, aluminum oxide, aluminum nitride, aluminum oxynitride, aluminum nitride oxide, silicon-germanium, carbon nitride, ITO, tin oxide, and the like; however, inorganic compounds are not limited to only these. Furthermore, for a simple substance other than an elemental metal, typically, there is silicon, germanium, carbon, and the like. Typically, there is amorphous silicon, amorphous germanium, diamond-like carbon (DLC), and the like; however, simple substances other than elemental metal substances are not limited to only these. The nonmetal inorganic film 103 can be formed by a CVD method, a sputtering method, an evaporation method, or the like.

It is to be noted that when the nonmetal inorganic film 103 is formed by a sputtering method or by a CVD method, the nonmetal inorganic film 103 may be formed such that, after one source gas (for example, dinitrogen oxide or oxygen) is introduced into a reaction chamber, a plasma is generated, and the molybdenum oxide film 102 is formed on the surface of the molybdenum film 101, other source gases are fed into the reaction chamber, and the nonmetal inorganic film 103 is formed.

Next, an organic compound film 104 is formed over the nonmetal inorganic film 103. It is preferable that the organic compound film 104 be formed of a material that has a high enough upper temperature limit to withstand a process temperature (greater than or equal to 180° C. and less than or equal to 500° C., preferably, greater than or equal to 200° C. and less than or equal to 400° C., even more preferably, greater than or equal to 250° C. and less than or equal to 350° C.) of a process that is to be performed during a subsequent step. Furthermore, it is preferable that the organic compound film 104 be formed of an elastic material that is resistant to bending and in which cracks do not readily form. In addition, it is preferable that the organic compound film 104 be formed of a material that transmits light. With the organic compound film 104 being able to transmit light, a transmissive liquid crystal display device can be fabricated. By formation of the organic compound film 104 at a thickness of 5 μm or more, preferably, at a thickness of greater than or equal to 10 μm and less than or equal to 100 μm, the organic compound film 104 can be made to function as a support for a semiconductor device that is to be formed in a subsequent step. For this reason, a support substrate used to support the semiconductor device need not be formed unnecessarily. In a fabrication method for the organic compound film 104, a composition is applied to the nonmetal inorganic film 103, and the nonmetal inorganic film 103 that is coated with the composition is baked at a temperature of greater than or equal to 180° C. and less than 500° C., preferably, at a temperature of greater than or equal to 200° C. and less than or equal to 400° C., and even more preferably, at a temperature of greater than or equal to 250° C. and less than or equal to 350° C. By heat treatment during a fabrication process of the organic compound film 104, the molybdenum oxide can be weakened, and separation in the vicinity of the molybdenum film 101 that is to be performed in a subsequent step becomes easy to do. For representative examples of the organic compound film 104, there is polyimide, polybenzoxazole, silicone, and the like. A cross-sectional process diagram of what is obtained after processes up to this stage have been completed is shown in FIG. 1A.

Next, an inorganic insulating film 105 may be formed over the organic compound film 104. The inorganic insulating film 105 functions as a base insulating film used to suppress diffusion of impurities from a glass substrate or an organic compound into a semiconductor film that is to be formed in a subsequent step and is formed as needed. The inorganic insulating film 105 can be formed of silicon nitride oxide, aluminum oxide, aluminum nitride, aluminum oxynitride, aluminum nitride oxide, or the like. For a typical example of a film that functions as a base insulating film, the inorganic insulating film 105 is made from a two-layer structure in which a silicon nitride oxide film formed at a thickness of from 50 nm to 100 nm by a plasma CVD (PCVD) method with $SiH_4$, $NH_3$, and $N_2O$ used as reactive gases and a silicon oxynitride film formed at a thickness of from 100 nm to 150 nm with $SiH_4$ and $N_2O$ used as reactive gases. Furthermore, for the inorganic insulating film 105, a three-layer structure of a silicon nitride oxide film, a silicon oxynitride film, and a silicon nitride film, stacked in the order given, may be used, as well.

Next, a first conductive film is formed over the inorganic insulating film 105, and a mask is formed over the first conductive film. The first conductive film is formed of a single layer of an element selected from Ta, W, Ti, Al, Cu, Cr, Nd, or the like or an alloy material or compound material with one of these elements as the main component or formed of stacked layers of any of these. In addition, for a formation method of the first conductive film, a sputtering method, an evaporation method, a CVD method, a coating method, or the like is used, as appropriate. Next, the first conductive film is etched using the mask, and a gate electrode 106 is formed.

Subsequently, a gate insulating film 107 is formed over the gate electrode 106. For the gate insulating film 107, an insulating film, such as a silicon nitride film, a silicon oxide film, a silicon oxynitride film, or the like, is used. Alternatively, a film obtained by application and baking of a composition that contains a siloxane polymer, a light-curable organic resin film, a heat-curable organic resin film, or the like may be used, as well.

Next, an amorphous semiconductor film 108 is formed over the gate insulating film 107. The amorphous semiconductor film 108 is formed of an amorphous semiconductor film or a microcrystal semiconductor film fabricated by a vapor-phase epitaxy method using a semiconductor material gas typified by silane or germanium, a sputtering method, or a thermal CVD method. In the present embodiment mode, for a semiconductor film, an example using an amorphous semiconductor film is given. Furthermore, for the semiconductor film, ZnO or an oxide of zinc-gallium-indium fabricated by a sputtering method or a pulsed laser deposition (PLD) method may be used; however, in this case, it is preferable that the gate insulating film be formed of an oxide that contains aluminum or titanium.

Figure 1B:
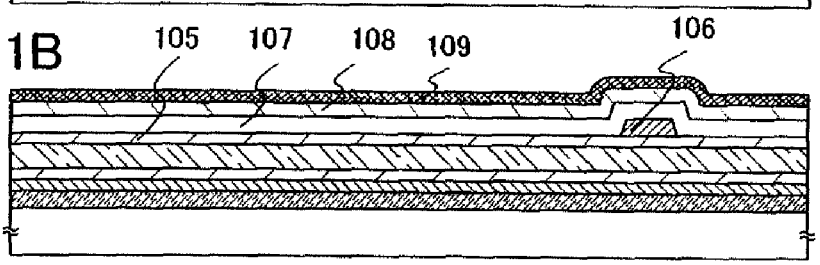

Subsequently, for a semiconductor film 109 that contains an impurity element of one conductivity type, a semiconductor film that contains an impurity element imparting n-type conductivity is formed at a thickness of from 20 nm to 80 nm. The semiconductor film that contains an impurity element imparting n-type conductivity is formed over the entire surface by a publicly disclosed method such as a publicly disclosed plasma CVD method, sputtering method, or the like. A cross-sectional process diagram of what is obtained after processes up to this stage have been completed is shown in FIG. 1B.

Subsequently, the amorphous semiconductor film 108 and the semiconductor film 109 that contains an impurity element imparting n-type conductivity are etched using a mask that is formed using a publicly disclosed photolithography technique, and an island-shaped amorphous semiconductor layer and a semiconductor layer that contains an impurity element of one conductivity type are obtained. It is to be noted that the amorphous semiconductor film 108 and the semiconductor film 109 that contains an impurity element imparting n-type conductivity may be etched as selected using a mask formed using a liquid droplet discharge method or a printing method (a relief printing method, a planographic printing method, an intaglio printing method, a screen printing method, or the like) instead of the publicly disclosed photolithography method.

Next, a composition that contains a conductive material (silver (Ag), gold (Au), copper (Cu), tungsten (W), aluminum (Al), or the like) is discharged as selected by a liquid droplet discharge method, and a source electrode and a drain electrode 112 and 113 are formed. It is to be noted that, instead of being formed by a liquid droplet discharge method, the source electrode and the drain electrode 112 and 113 may also be formed by formation of a metal (Ta, W, Ti, Al, Cu, Cr, Nd, or the like) film by a sputtering method and then etching of the metal film using a mask that is formed by a publicly disclosed photolithography technique.

Next, semiconductor layers 114 and 115 that each contain an impurity element of one conductivity type are formed by etching of the semiconductor layer that contains an impurity element of one conductivity type using the source electrode and drain electrode 112 and 113 as masks. In addition, an upper part of the island-shaped amorphous semiconductor layer is etched using the source electrode and drain electrode 112 and 113 as masks, and an island-shaped amorphous semiconductor layer 116 is formed. An exposed portion of the island-shaped amorphous semiconductor layer 116 is a place that functions as a channel formation region of a thin film transistor.

Subsequently, a protective film 117 is formed in order to prevent contamination of the channel formation region of the island-shaped amorphous semiconductor film 116 with impurities. For the protective film 117, silicon nitride obtained by a sputtering method or a PCVD method or a material that contains silicon nitride oxide as its main component is used. Hydrogenation treatment may be performed. In this way, a thin film transistor 111 is fabricated.

Next, an interlayer insulating film 118 is formed over the protective film 117. Furthermore, the interlayer insulating film 118 is formed using a resinous material such as an epoxy resin, an acrylic resin, a phenolic resin, a novolac resin, a melamine resin, a urethane resin, or the like. In addition, an organic material, such as benzocyclobutane, parylene, polyimide that can transmit light, or the like, or the like can be used, as well. Furthermore, for the interlayer insulating film 118, an insulating film, such as a silicon oxide film, a silicon nitride film, a silicon oxynitride film, or the like, can be used, or stacked layers of any of these insulating films and the above-mentioned resin materials may be used, as well.

Next, the protective film 117 and the interlayer insulating film 118 are removed as selected using a mask formed using a publicly disclosed photolithography technique, and a contact hole that reaches through to the source electrode or drain electrode 112 is formed.

Next, a composition that contains a conductive material (silver (Ag), gold (Au), copper (Cu), tungsten (W), aluminum (Al), or the like) is discharged as selected by a liquid droplet discharge method, and a first electrode 119 that is electrically connected to the source electrode or drain electrode 112 is formed. Furthermore, a second electrode 120, which, along with the first electrode 119, forms an electric field in a direction parallel to the surface of the substrate, is formed by the liquid droplet discharge method. It is to be noted that it is preferable that the first electrode 119 and the second electrode 120 be arranged at an equal distance from each other, and the shape of the upper surface of each of the electrodes may be formed as a comb-like shape. It is to be noted that the first electrode 119 and the second electrode 120 each function as a pixel electrode of a liquid crystal display device.

Figure 1C:
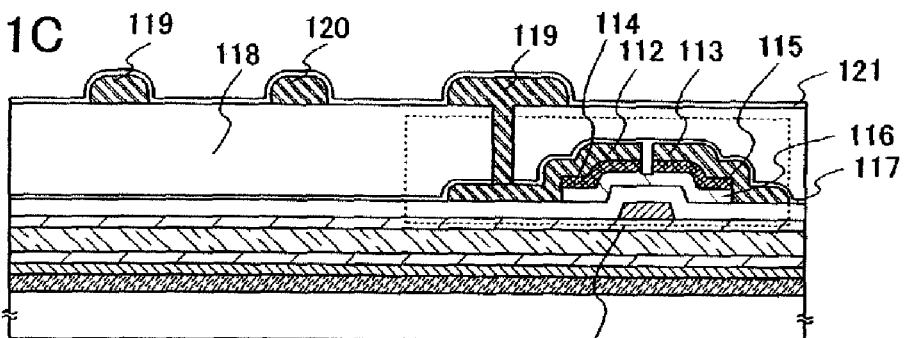

Next, an orientation film 121 used to cover the first electrode 119 and the second electrode 120 is formed. A cross-sectional process diagram of what is obtained after processes up to this stage have been completed is shown in FIG. 1C.

Next, a flexible substrate 133 is affixed using a liquid crystal material, here, a polymer-dispersed liquid crystal, so as to be opposite the substrate 100. Polymer-dispersed liquid crystals are divided into two types depending on the dispersion state of the liquid crystal and polymer material. The first type is a type in which droplets of a liquid crystal are dispersed throughout a polymer material, where the liquid crystal is discontinuous (referred to as PDLC); the other type is a type in which the polymer material forms a network in the liquid crystal, where the liquid crystal is continuous (referred to as PNLC). It is to be noted that, in the present embodiment mode, either type may be used, but a PDLC is used here. In the present embodiment mode, a polymer material 131 that contains a liquid crystal 132 is used to affix the flexible substrate 133. If necessary, a sealing material may be provided so as to surround the polymer material 131. Furthermore, if necessary, a spacer material (a bead spacer, a columnar spacer, a fiber, or the like) may be used to control the thickness of the polymer material 131. Moreover, a publicly disclosed liquid crystal material may be used instead of the polymer-dispersed liquid crystal.

Figure 1D:
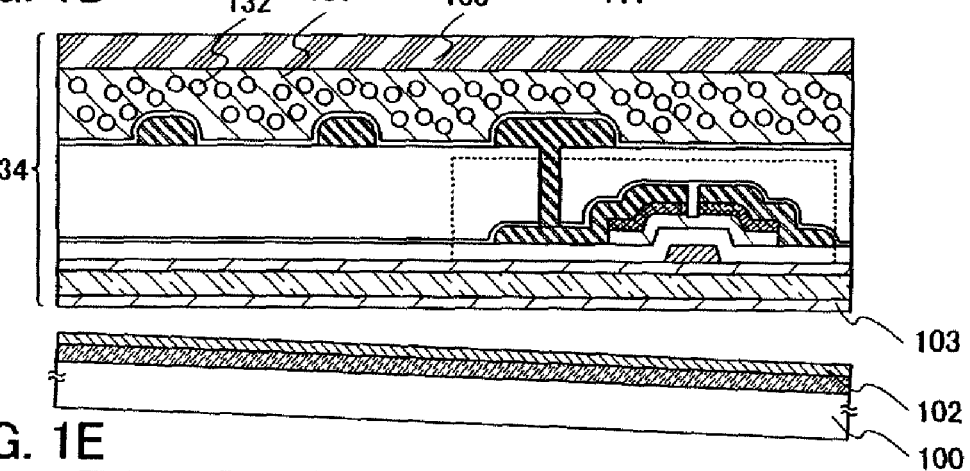

Subsequently, a stacked-layer body 134 that includes the nonmetal inorganic film 103, the organic compound film 104, the thin film transistor 111, and the flexible substrate 133 is separated from the substrate 100. Because the molybdenum oxide film is brittle, separation can be performed with relatively little force. In FIG. 1D, a diagram is shown in which the stacked-layer body 134 is separated from the substrate 100 at the interface between the molybdenum oxide film 102 and the nonmetal inorganic film 103; however, there are no limitations, in particular, on the place where the stacked-layer body 134 is separated from the substrate 100 as long as the stacked-layer body 134 is separated from the substrate 100 in a region where the thin film transistor receives no damage and somewhere between the nonmetal inorganic film 103 and the substrate 100. For example, the stacked-layer body 134 may be separated from the substrate 100 at a place within the molybdenum film or within the molybdenum oxide film, or the stacked-layer body 134 may be separated from the substrate 100 at an interface between the substrate and the molybdenum film or at an interface between the molybdenum film and the molybdenum oxide film. However, in the case in which a transmissive liquid crystal display device is fabricated, when the stacked-layer body 134 is separated from the substrate 100 at an interface between the substrate and the molybdenum film and the molybdenum film is left remaining over the nonmetal inorganic film 103, it is preferable that the molybdenum film be removed during a subsequent step. In addition, the nonmetal inorganic film 103 may be removed, as well, as necessary.

It is to be noted that, when a plurality of liquid crystal display devices is included in a stacked-layer body that includes the organic compound film 104, the thin film transistor 111, and the flexible substrate 133, the stacked-layer body may be divided up and the plurality of liquid crystal display devices cut apart. By this kind of step, a plurality of liquid crystal display devices can be fabricated by a single separation step.

Figure 1E:
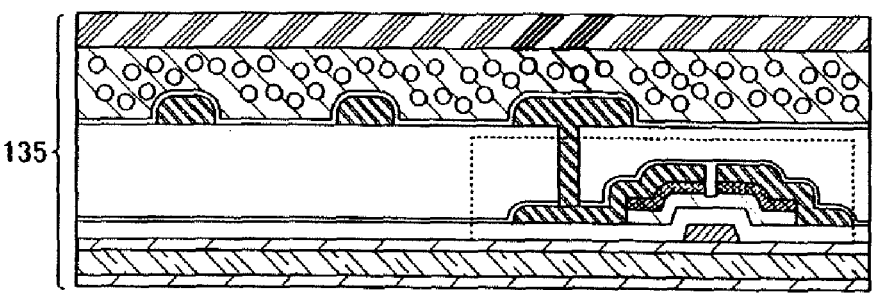

By the above steps, as shown in FIG. 1E, an active matrix liquid crystal display device 135 that uses amorphous silicon thin film transistors can be fabricated. The adhesiveness of a conductive film formed by a liquid droplet discharge method is weak; however, when the separation method of the present invention that uses a molybdenum film is used, even if a conductive layer formed by a liquid droplet discharge method is used in one part of a wiring, separation can be done in the vicinity of the molybdenum oxide film (at an interface between the molybdenum oxide film 102 and the nonmetal inorganic film 103 in the present embodiment mode). The liquid crystal display device of the present embodiment mode is thin and has flexibility. In addition, by provision of an organic compound film between the molybdenum oxide film and the thin film transistor, the organic compound film can be made to function as a support of the liquid crystal display device. For this reason, a support substrate used to support the liquid crystal display device need not be formed unnecessarily, and costs can be reduced.

It is to be noted that if the mechanical strength of the liquid crystal display device is low, a flexible substrate may be affixed to the surface at which separation is performed using an adhesive layer. In this case, in order to preserve the width of a space between substrates despite changes in temperature, it is preferable that a flexible substrate with the same coefficient of thermal expansion as the flexible substrate 133 be used.

Furthermore, an electrophoretic display may be fabricated, as well, using electronic ink instead of a polymer-dispersed liquid crystal. In this case, after the first electrode 119 and the second electrode 120 are formed, electronic ink may be applied by a printing method and then baked and affixed by the flexible substrate 133. Then, sealing may be performed using another flexible substrate after separation from the substrate is performed.

Embodiment Mode 2

Here, an example in which an active matrix light-emitting device that uses organic thin film transistors is fabricated will be described using FIGS. 2A to 2D.

Figure 2A:
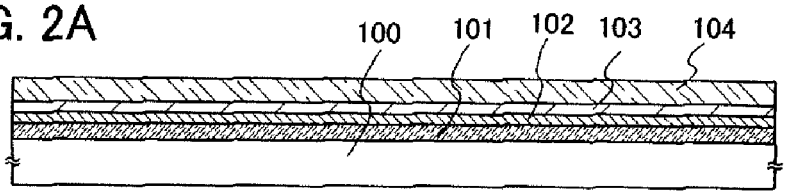
FIGS. 2A to 2D are cross-sectional-view diagrams used to describe a manufacturing method for a semiconductor device of the present invention.

As in Embodiment Mode 1, the molybdenum film 101 is formed over the substrate 100, the molybdenum oxide film 102 is formed over the molybdenum film 101, the nonmetal inorganic film 103 is formed over the molybdenum oxide film 102, and the organic compound film 104 is formed over the nonmetal inorganic film 103. A cross-sectional process diagram of what is obtained after processes up to this stage have been completed is shown in FIG. 2A.

Next, the inorganic insulating film 105 may be formed over the organic compound film 104. Subsequently, a conductive layer 211 that is to be used as a gate electrode is formed over the organic compound film 104 or over the inorganic insulating film 105. For a material used in the conductive layer 211, a metal that is made to be insulative by either nitridation or oxidation or by both nitridation and oxidation should be used, and, in particular, tantalum, niobium, aluminum, copper, and titanium are preferable. In addition to these elements, there is also tungsten, chromium, nickel, cobalt, magnesium, and the like. There are no particular limitations on the type of formation method used to form the conductive layer 211; the conductive layer 211 may be formed by a method in which, after a conductive film is formed by a sputtering method, an evaporation method, or the like, the conductive film is processed into a desired shape by a method such as etching or the like. In addition, the conductive layer 211 may also be formed by an inkjet printing method or the like using droplets that contain a conductive material.

Next, a gate insulating film 212 made from an oxide, a nitride, or an oxynitride of one of the above metals by either nitridation or oxidation or by both nitridation and oxidation of the conductive layer 211 is formed. It is to be noted that a part of the conductive layer 211 other than the gate insulating film 212, which is made to be insulative, function as a gate electrode.

Subsequently, a semiconductor layer 213 is formed to cover the gate insulating film 212. For an organic semiconductor material used to form the semiconductor layer 213, either a material with a low molecular weight or a material with a high molecular weight can be used, as long as it is an organic material that has carrier transportability and one in which changes in the carrier density due to electric field effects are possible; there are no particular limitations on the type of material used, and polycyclic aromatic compounds, conjugated double bond compounds, metal phthalocyanine complexes, charge-transfer complexes, condensed ring tetracarboxylic acid diimides, oligothiophenes, fullerenes, carbon nanotubes, and the like can be given. For example, polypyrrole, polythiophene, poly(3-alkylthiophene), polyphenylenevinylene, poly(p-phenylenevinylene), polyaniline, polydiacetylene, polyazulene, polypyrene, polycarbazole, polyselenophene, polyfuran, poly(p-phenylene), polyindole, polypyridazine, naphthacene, hexacene, heptacene, pyrene, chrysene, perylene, coronene, terrylene, ovalene, quaterrylene, circumanthracene, triphenodioxazine, triphenodithiazine, hexacene-6,15-quinone, polyvinyl carbazole, polyphenylene sulfide, polyvinylene sulfide, polyvinylpyridine, naphthalene tetracarboxylic acid diimide, anthracene tetracarboxylic acid diimide, C60, C70, C76, C78, and C84 and derivatives of any of these can be used. Furthermore, for specific examples of these materials, tetracene, pentacene, sexithiophene (6T), copper phthalocyanine, bis(1,2,5-thiadiazolo)-p-quinobis(1,3-dithiole), rubrene, poly(2,5-thienylene vinylene) (PTV), poly(3-hexylthiophene-2,5-diyl) (P3HT), and poly(9,9'-dioctyl-fluorene-co-bithiophene) (F8T2), which are generally considered to be p-type semiconductors; and 7,7,8,8-tetracyanoquinodimethane (TCNQ), 3,4,9,10-perylenetetracarboxylic dianhydride (PTCDA), 1,4,5,8-naphthalenetetracarboxylic dianhydride (NTCDA), N,N'-dioctyl-3,4,9,10-perylenetetracarboxylic diimide (PTCD1-C8H), copper hexadecafluorophthalocyanine ($F_{16}$CuPc);N,N'-2,2,3,3,4,4,5,5,6,6,7,7,7-di-15-hexylfluoride-1,4,5,8-naphthalenetetracarboxylic diimide (NTCD1-C8F), 3',4'-dibutyl-5,5''-bis(dicyanomethylene)-5,5''-dihydro-2,2':5',2''-terthiophene) (DCMT), and methanofullerene [6,6]-phenyl-$C_{61}$ butyric acid methyl ester (PCBM), which are generally considered to be n-type semiconductors; and the like can be given. It is to be noted that the attributes of p-type and n-type of organic semiconductors are not inherent characteristics of the materials themselves but depend on the relationship between the material and an electrode from which carriers are injected or the strength of the electric field when carriers are injected, and semiconductor materials tend toward one of p-type and n-type but can be used as either one. It is to be noted that, in the present embodiment mode, using p-type semiconductors is more preferable than using n-type semiconductors.

These organic semiconductor materials can be used to form films by an evaporation method, a spin-coating method, a liquid droplet discharge method, or the like.

Next, a buffer layer 214 is formed over the semiconductor layer 213 in order to improve adhesiveness and the chemical stability at an interface. For the buffer layer 214, an organic material that has conductivity (an organic compound that exhibits electron-acceptability, for example, 7,7,8,8-tetracyanoquinodimethane (TCNQ); 2,3,5,6-tetrafluoro-7,7,8,8-tetracyanoquinodimethane ($F_4$-TCNQ); or the like) or a composite material of an organic compound and a metal oxide may be used. It is to be noted that the buffer layer 214 need not be formed if it is not needed.

Next, a source electrode and a drain electrode 215 are formed over the buffer layer 214. There are no particular limitations on the materials used for the source electrode and drain electrode 215; however, a metal such as gold, platinum, aluminum, tungsten, titanium, copper, tantalum, niobium, chromium, nickel, cobalt, magnesium, or the like or an alloy that contains any of these metals can be used. In addition, for other materials that can be used for the source electrode and drain electrode 215, a conductive macromolecular compound such as polyaniline, polypyrrole, polythiophene, polyacetylene, polydiacetylene, and the like can be given. It is to be noted that there are no limitations on the formation method of the source electrode and drain electrode 215 as long as it is a method with which the semiconductor layer 213 is not degraded, and the source electrode and drain electrode 215 may be fabricated by being processed into a desired shape by a method such as etching or the like after film formation by a sputtering method, an evaporation method, or the like. Furthermore, the source electrode and drain electrode 215 may be formed by an inkjet printing method or the like using liquid droplets that contain a conductor. By the above process, an organic transistor 227 can be fabricated.

In addition, an organic insulating material of polyimide, polyamic acid, polyvinyl phenyl, or the like may be formed in contact with the lower surface of the semiconductor layer 213. By this kind of structure, orientation of the organic insulating material can be improved even more, and adhesiveness between the gate insulating film 212 and the semiconductor layer 213 can be improved even more.

Next, a fabrication method of a light-emitting device that uses the organic transistor 227 will be described.

Next, an interlayer insulating film 228 is formed to cover the organic transistor 227. Then, the interlayer insulating film 228 is etched as selected, and a contact hole that reaches either one of the source electrode and drain electrode 215 is formed. Next, a first electrode 210 that is electrically connected to the one of the source electrode and drain electrode 215 to which the contact hole reaches is formed. Then, a partition wall 221 is formed to cover edges of the first electrode 210. The partition wall 221 is formed using an insulating material and fulfills a function to provide insulation between a plurality of the first electrodes 210 that is arranged adjacent to each other.

Next, a light-emitting layer 222 is formed over a region of the first electrode 210 that does not come into contact with the partition wall 221. For materials used in the light-emitting layer 222, in many cases, a single layer or stacked layers of an organic compound or a single layer or stacked layers of an inorganic compound is used; in the present specification, the material is set to include a structure in which an inorganic compound is used in a part of a film formed from an organic compound. For each of the layers in a light-emitting element, there are no limitations on the stacked-layer method used. If forming stacked layers is possible, any kind of technique, including a vacuum vapor deposition method, a spin coating method, an inkjet printing method, a dip coating method, or the like, may be selected.

Next, a second electrode 223 is formed over the light-emitting layer 222. A light-emitting element is formed at the place where the first electrode 210, the second electrode 223, and the light-emitting layer 222 overlap with each other. It is to be noted that this light-emitting element has a layer that contains an organic compound or a layer that contains an inorganic compound, with which luminescence (electroluminescence) generated by application of an electric field is obtained (hereinafter, this type of layer will be referred to as an EL layer); an anode; and a cathode. In particular, an inorganic EL element using a ZnS:Mn inorganic thin film and an organic EL element using an organic evaporation thin film are bright, indicate highly efficient EL light emission, and are suitable for application in a display. It is to be noted that there are no particular limitations on the structure of the light-emitting element.

Next, a protective film 224 is formed over the second electrode 223. It is to be noted that the protective film 224 need not be formed if it is not needed.

Figure 2B:
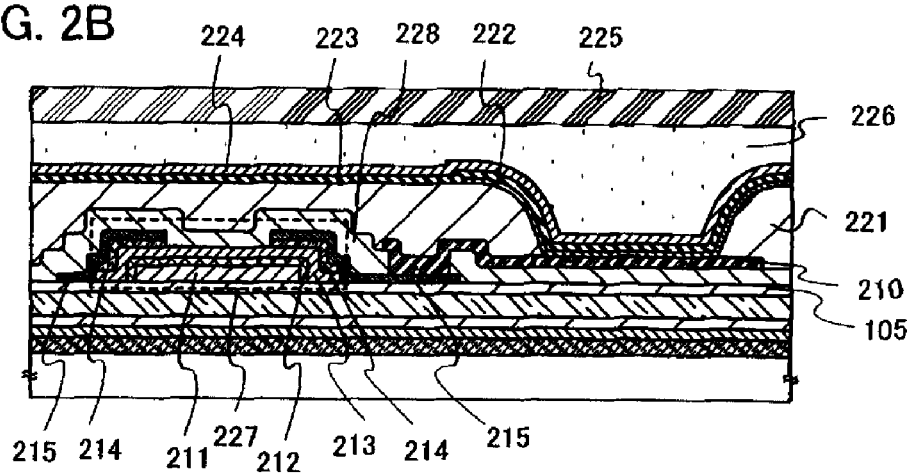

Next, a flexible substrate 225 is affixed over the protective film 224 by an adhesive layer 226. Although not shown in the diagrams, a sealant may be placed so as to enclose the adhesive layer 226 in order to strengthen sealing. A cross-sectional process diagram of what is obtained after processes up to this stage have been completed is shown in FIG. 2B.

Figure 2C:
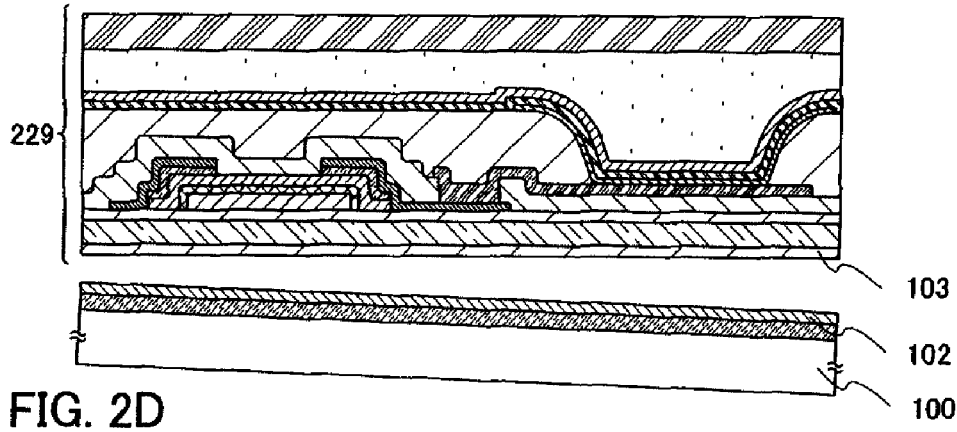
Figure 2D:
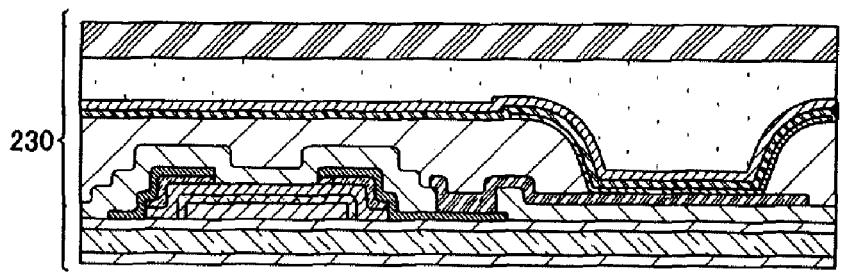

Next, a stacked-layer body 229 that includes the nonmetal inorganic film 103, the organic compound film 104, the organic transistor 227, the light-emitting element, and the flexible substrate 225 is separated from the substrate 100. In FIG. 2C, a diagram is shown in which the stacked-layer body 229 is separated from the substrate 100 at the interface between the molybdenum oxide film 102 and the nonmetal inorganic film 103. It is to be noted that, after the stacked-layer body 229 is separated from the substrate 100, the nonmetal inorganic film 103 may be removed, as necessary.

It is to be noted that, when a plurality of light-emitting devices is included in the stacked-layer body 229 that includes the organic compound film 104, the organic transistor 227, and the flexible substrate 225, the stacked-layer body may be divided up and the plurality of light-emitting devices cut apart. By this kind of step, a plurality of light-emitting devices 230 can be fabricated by a single separation step.

By the steps given above, the active matrix light-emitting device 230 that uses an organic transistor can be fabricated. For example, the adhesiveness of a light-emitting layer formed by an evaporation method is weak; however, when the separation method of the present invention that is used in the vicinity of a molybdenum oxide film is used, even if a light-emitting layer formed by an evaporation method is used, separation can be done in the vicinity of the molybdenum oxide film (at an interface between the molybdenum oxide film 102 and the nonmetal inorganic film 103 in the present embodiment mode). The light-emitting device of the present embodiment mode is thin and has flexibility. Moreover, by provision of an organic compound film between a molybdenum oxide film and a thin film transistor, the organic compound film can be made to function as a support of the light-emitting device. For this reason, a support substrate used to support the light-emitting device need not be formed unnecessarily, and costs can be reduced.

Figure 15A:
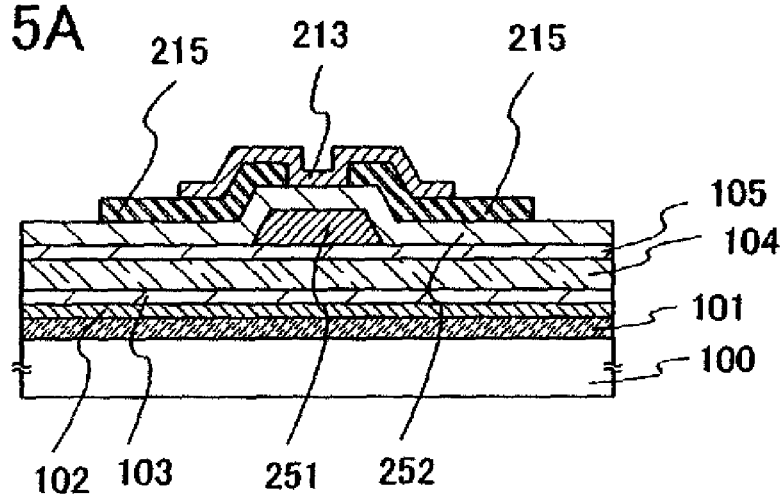
FIGS. 15A and 15B are diagrams, each illustrating an example of the structure of a cross section of an organic thin film transistor.
Figure 15B:
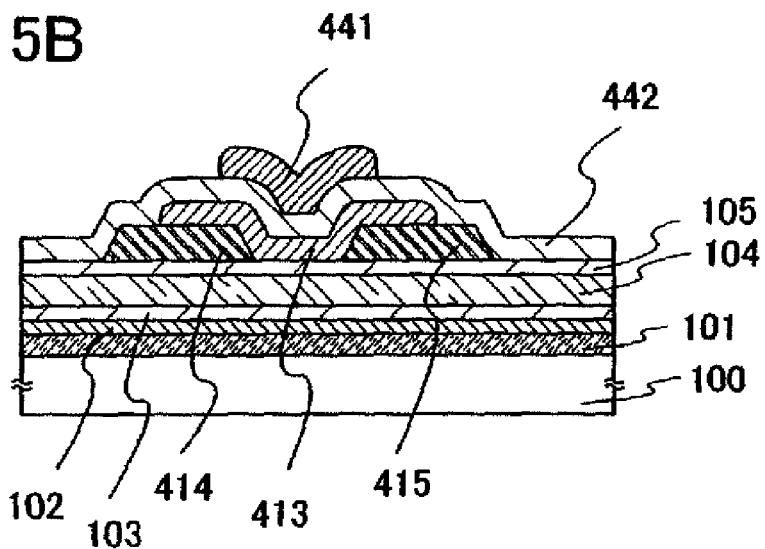

Furthermore, the present invention is not limited to having the structure of the organic transistor 227 shown in FIG. 2C but may be set to have the structure shown in FIG. 15A or 15B.

The structure of FIG. 15A is a structure that is referred to as a bottom-contact structure. It is to be noted that the same reference numerals are used for parts common to those of FIGS. 2A to 2D. When a bottom-contact structure is used, a process, such as a photolithography process or the like, provided for microfabrication of a source wiring and a drain wiring can be used with little difficulty. For this reason, the structure of the organic transistor should be selected as appropriate based on these advantages and disadvantages.

The molybdenum film 101, the molybdenum oxide film 102, the nonmetal inorganic film 103, the organic compound film 104, and the inorganic insulating film 105 are stacked over the substrate 100. A gate electrode 251 is formed over the inorganic insulating film 105. There are no particular limitations on the materials used to form the gate electrode 251; for example, a metal such as gold, platinum, aluminum, tungsten, titanium, copper, molybdenum, tantalum, niobium, chromium, nickel, cobalt, magnesium, or the like or an alloy that contains any of these metals or a conductive macromolecular compound such as polyaniline, polypyrrole, polythiophene, polyacetylene, polydiacetylene, polysilicon that is doped with an impurity, and the like can be given. It is to be noted that there are no particular limitations on the formation method of the gate electrode 251, and the gate electrode 251 may be fabricated by being processed into a desired shape by a method such as etching or the like after film formation by a sputtering method, an evaporation method, or the like. Furthermore, the gate electrode 251 may be formed by an inkjet printing method or the like using liquid droplets that contain a conductor.

A gate insulating film 252 is formed to cover the gate electrode 251. The gate insulating film 252 is formed using an inorganic insulating material such as silicon oxide, silicon nitride, silicon oxynitride, or the like. It is to be noted that the gate insulating film 252 of any of these materials can be formed by film formation by a coating method such as a dipping method, a spin coating method, or a liquid droplet discharge method; a CVD method; a sputtering method; or the like. Either nitridation or oxidation or both nitridation and oxidation using a high-density plasma may be performed on this gate insulating film 252. By high-density plasma nitridation, a silicon nitride film that contains silicon at an even higher concentration can be obtained. The high-density plasma is generated by use of high-frequency microwaves, for example, microwaves with a frequency of 2.45 GHz. By use of this kind of high-density plasma, oxygen (or a gas that contains oxygen), nitrogen (or a gas that contains nitrogen), or the like can be activated by plasma excitation, and these can be made to react with an insulating film. With a high-density plasma that has the characteristic of having a low electron temperature, because the kinetic energy of an active species is low, a film can be formed with less plasma damage and fewer defects compared to a film formed by conventional plasma treatment. In addition, with use of a high-density plasma, because the amount of roughness on the surface of the gate insulating film 252 can be reduced, carrier mobility can be increased. Furthermore, matching up the orientation of organic semiconductor materials used to form the semiconductor layer formed over the gate insulating film 252 becomes easy to do.

Next, a source electrode and a drain electrode 215 are formed over the gate insulating film 252. Then, the semiconductor layer 213 is formed between the source electrode and drain electrode 215. For the semiconductor layer 213 shown here, the same materials that are used to form the semiconductor layer 213 shown in FIG. 2B as described above can be used.

Furthermore, the structure of FIG. 15B will be described. The structure of FIG. 15B is a structure that is referred to as a top-gate structure.

The molybdenum film 101, the molybdenum oxide film 102, the nonmetal inorganic film 103, the organic compound film 104, and the inorganic insulating film 105 are stacked over the substrate 100. A source electrode and a drain electrode 414 and 415 are formed over the inorganic insulating film 105. Next, a semiconductor layer 413 is formed between the source electrode and drain electrode 414 and 415. Then, a gate insulating film 442 is formed to cover the semiconductor layer 413 and the source electrode and drain electrode 414 and 415. Next, a gate electrode 441 is formed over the gate insulating film 442. The gate electrode 441 overlaps with the semiconductor layer 413 with the gate insulating film 442 interposed between the gate electrode 441 and the semiconductor layer 413.

Even with these kinds of structures of organic transistors, separation can be performed by use of the present invention. For example, the adhesiveness of a semiconductor layer formed by a coating method is weak; however, when the separation method of the present invention that is used in the vicinity of a molybdenum oxide film is used, even if a semiconductor layer formed by a coating method is used, separation can be done in the vicinity of the molybdenum film (at an interface between the molybdenum oxide film 102 and the nonmetal inorganic film 103 in the present embodiment mode).

In addition, a transistor that uses a semiconductor layer formed of ZnO or an oxide of zinc-gallium-indium fabricated by a sputtering method or a PLD method can be used instead of an organic transistor. In this case, the structure in FIG. 15A or 15B can be applied. Furthermore, when ZnO or an oxide of zinc-gallium-indium is used in a semiconductor layer, it is preferable that the gate insulating film be set to be an oxide that contains aluminum or titanium. As thus described, the present invention is useful in formation of a transistor that includes a process for irradiation of a substrate with a plasma; after the transistor is formed over a substrate that can withstand the plasma, a flexible substrate that has low endurance toward plasma is attached thereto and the transistor is separated from the substrate, whereby a light-emitting device can be fabricated.

It is to be noted that if the mechanical strength of the light-emitting device is low, a flexible substrate may be affixed to the surface at which separation is performed using an adhesive layer. In this case, in order to preserve a space between substrates despite changes in temperature, it is preferable that a flexible substrate with the same coefficient of thermal expansion as the flexible substrate 225 be used.

Furthermore, the present embodiment mode can be freely combined with Embodiment Mode 1. For example, a liquid crystal display device that uses the organic transistors given in Embodiment Mode 2 instead of the amorphous thin film transistors given in Embodiment Mode 1 can be fabricated. In addition, a light-emitting device that uses the amorphous thin film transistors given in Embodiment Mode 1 instead of the organic transistors given in Embodiment Mode 2 can be fabricated, as well.

Embodiment Mode 3

Here, an example in which a passive matrix light-emitting device is fabricated over a flexible substrate will be described using FIGS. 5A to 5C, FIG. 6, FIG. 7, FIGS. 8A and 8B, and FIG. 9.

A passive matrix (simple matrix) light-emitting device has a structure in which a plurality of anodes is provided in parallel stripe form (band form) and a plurality of cathodes is provided in parallel stripe form so that the plurality of anodes and the plurality of cathodes are perpendicular to each other and a structure in which a light-emitting layer or a fluorescent layer is inserted at an intersection of each of the plurality of anodes and plurality of cathodes. Consequently, a pixel located at an intersection of a selected anode (an anode to which a voltage is applied) and a selected cathode comes to be lit up.

Figure 5A:
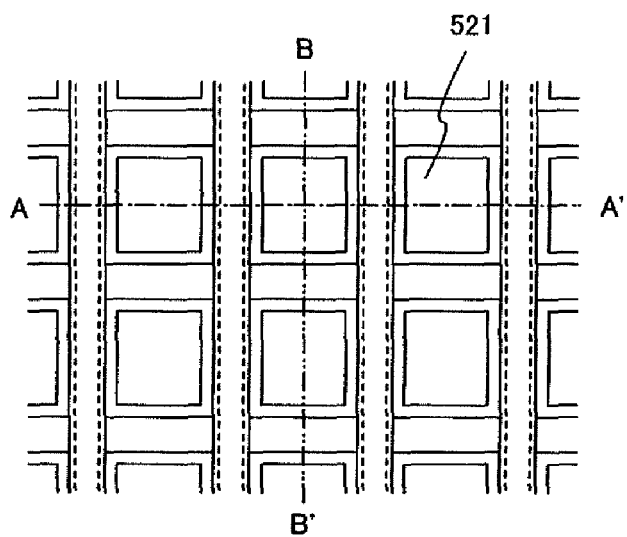
FIG. 5A is a top-view diagram and FIGS. 5B and 5C are cross-sectional-view diagrams, each used to describe a structure of a semiconductor device of the present invention.
Figure 5C:
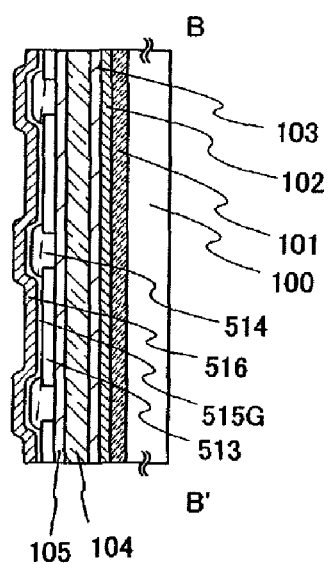
Figure 5B:
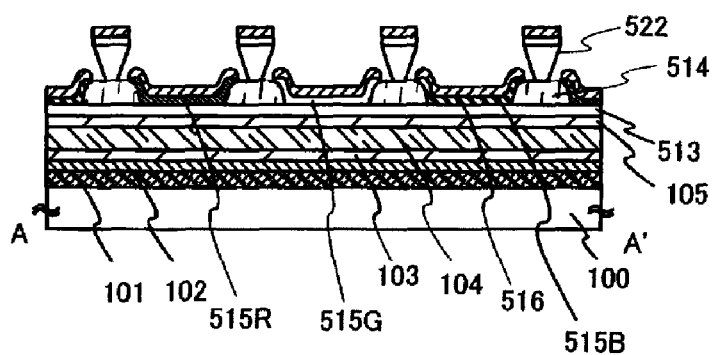

FIG. 5A is a diagram illustrating a top view of a pixel portion before a flexible substrate is attached to a second electrode 516 of a light-emitting element. FIG. 5B is a cross-sectional view of a cross section taken along a dotted line A-A' in FIG. 5A, and FIG. 5C is a cross-sectional view of a cross section taken along a dotted line B-B' in FIG. 5A.

Over the substrate 100, as in Embodiment Mode 2, the molybdenum film 101, the molybdenum oxide film 102, the nonmetal inorganic film 103, the organic compound film 104, and the inorganic insulating film 105 are formed. Over the inorganic insulating film 105, a plurality of first electrodes 513 is arranged in stripe form with equal spacing between adjacent first electrodes 513. Furthermore, over the first electrodes 513, a partition wall 514 that has openings, with each opening corresponding to a pixel, is provided, and the partition wall 514 that has openings is formed of an insulating material (an organic material (a photosensitive or photosensitive organic material (polyimide, acrylic, polyamide, polyimide-amide, a resist, or benzocyclobutane) or an SOG film (for example, an $SiO_x$ film that has an alkyl group)). It is to be noted that each opening corresponding to a pixel acts as a light-emitting region 521.

Over the partition wall 514 that has openings, a plurality of mutually parallel reverse taper partition walls 522 is provided to intersect with the first electrodes 513. The reverse taper partition walls 522 are formed by a photolithography method along with adjustment of the amount of exposure to light and length of time for image development so that the lower part of a pattern is etched more than other parts using a positive photosensitive resin with an unexposed part left remaining as the pattern.

Figure 6:
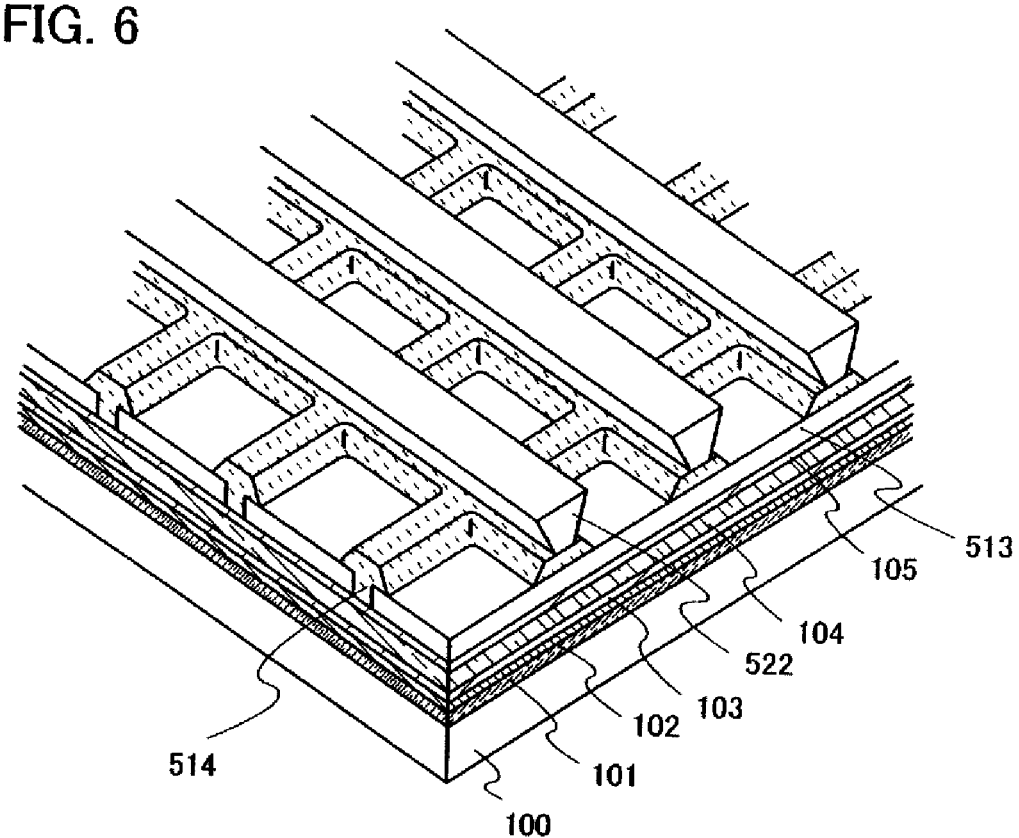
FIG. 6 is a perspective-view diagram used to describe a structure of a semiconductor device of the present invention.

Furthermore, a perspective-view diagram illustrating the device right after the plurality of parallel reverse taper partition walls 522 has been formed is shown in FIG. 6.

The height of the reverse taper partition wall 522 is set to be greater than the combined film thicknesses of a stacked-layer film that includes a light-emitting layer and a conductive film. The stacked-layer film that includes a light-emitting layer and the conductive film, formed and stacked together with respect to the substrate that has the structure shown in FIG. 6, are separated into a plurality of electrically independent regions as shown in FIGS. 5A to 5C, and stacked-layer films 515R, 515G, and 515B that each include a light-emitting layer and second electrodes 516 are formed. The second electrodes 516 are mutually parallel striped-shaped electrodes that extend in a direction of intersection with the first electrodes 513. It is to be noted that the stacked-layer films that each include a light-emitting layer and the conductive films are formed over the reverse taper partition walls 522; however, they are isolated from the stacked-layer films 515R, 515G, and 515B that each include a light-emitting layer and the second electrodes 516.

Here, an example in which a light-emitting device by which full-color display can be achieved, where emission of three different colors of light (R, G, and B) is obtained by formation of the stacked-layer films 515R, 515G, and 515B that each include a light-emitting layer as selected, is fabricated is shown. The stacked-layer films 515R, 515G, and 515B that each include a light-emitting layer are formed into a mutually parallel stripe pattern.

Furthermore, light-emitting elements of a single color may be provided by formation of stacked-layer films that each include a light-emitting layer that emits light of the same emission color over the entire surface, and the light-emitting device may be set to be one by which monochrome display can be achieved or one by which area color display can be achieved. In addition, the light-emitting device may be set to be one by which full-color display can be achieved by combination of a color filter and a light-emitting device in which emission of white light is obtained.

Figure 7:
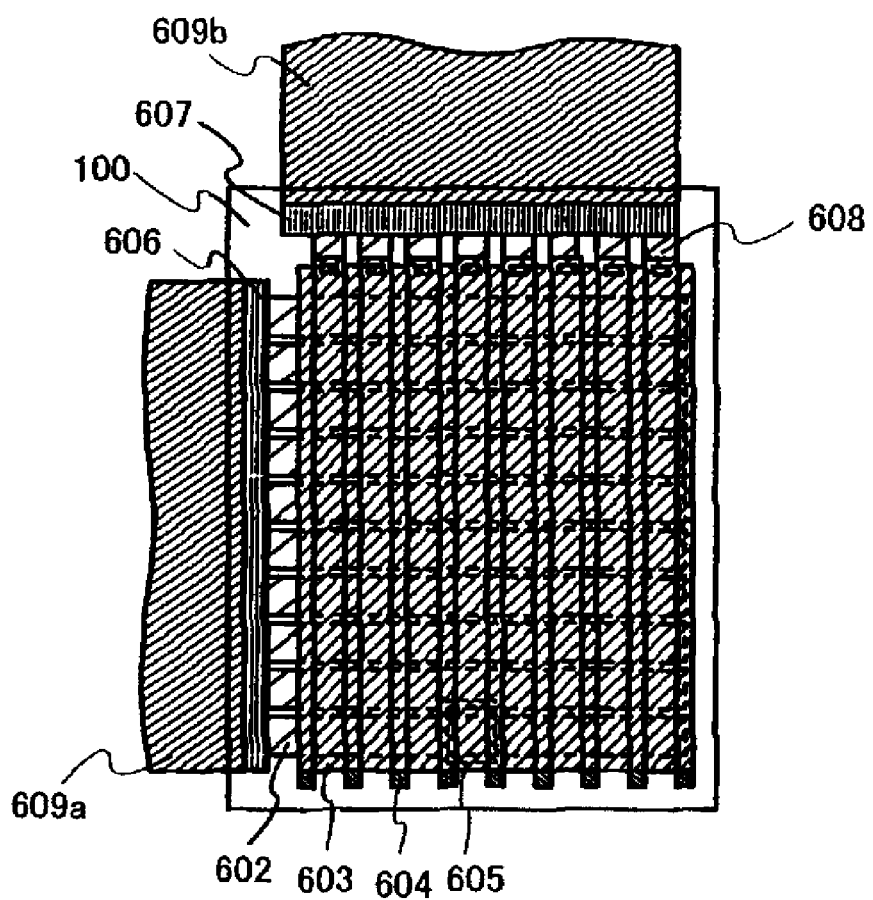
FIG. 7 is a top-view diagram used to describe a structure of a semiconductor device of the present invention.

Next, a top-view diagram of a light-emitting module in which an FPC or the like is mounted is shown in FIG. 7.

It is to be noted that "light-emitting devices" in the present specification refers to image display devices, light-emitting devices, and light sources (which include lighting systems). Moreover, modules in which a connector, for example, a flexible printed circuit (an FPC), a tape automated bonding tape (TAB tape), or a tape carrier package (TCP) is attached to a light-emitting device; modules in which the edge of a TAB tape or a TCP is attached to a printed circuit board; and modules in which integrated circuits (ICs) are directly mounted into light-emitting elements by a chip on glass (COG) method are all considered to be included in the term "light-emitting device."

In a pixel portion forming an image display as shown in FIG. 7, scanning lines and data lines are arranged to intersect with each other so that the scanning lines and data lines are mutually orthogonal.

The first electrode 513, the second electrode 516, and the reverse taper partition wall 522 of FIGS. 5A to 5C correspond to a scanning line 602, a data line 603, and a partition wall 604 of FIG. 7, respectively. A light-emitting layer is interposed between the data line 603 and the scanning line 602, and an intersection indicated by a region 605 is defined as a single pixel.

It is to be noted that the data line 603 is electrically connected to a connecting wiring 608 that is formed of conductive layers 829 and 830 at the edge of the wiring, and the connecting wiring 608 is connected to an FPC 609b via an input terminal 607. In addition, the scanning line 602 is connected to an FPC 609a via an input terminal 606.

Next, a flexible substrate is attached using an adhesive layer.

Next, the light-emitting element is separated from the substrate 100. It is to be noted that, after the light-emitting element is separated from the substrate 100, the nonmetal inorganic film 103 may be removed, as necessary.

In addition, if needed, optical films, such as a polarizer, a circular polarizer (including an elliptical polarizer), a retarder plate (a quarter-wave plate, a half-wave plate), a color filter, and the like, may be provided on a projection surface of the light-emitting element, as appropriate. Moreover, an antireflective film may be provided over the polarizer or circular polarizer, and the number of reflections can be reduced. Furthermore, antiglare treatment by which reflection of light due to unevenness over a surface can be diffused and glare can be reduced can be provided.

By the above steps, a flexible passive matrix light-emitting device can be fabricated. Because thermocompression bonding is performed to mount an FPC in a light-emitting device, it is preferable that mounting of the FPC by thermocompression bonding be performed on a hard substrate. By the present invention, by performance of separation after an FPC has been mounted in a light-emitting device, a thin light-emitting device that is flexible can be fabricated.

Figure 8A:
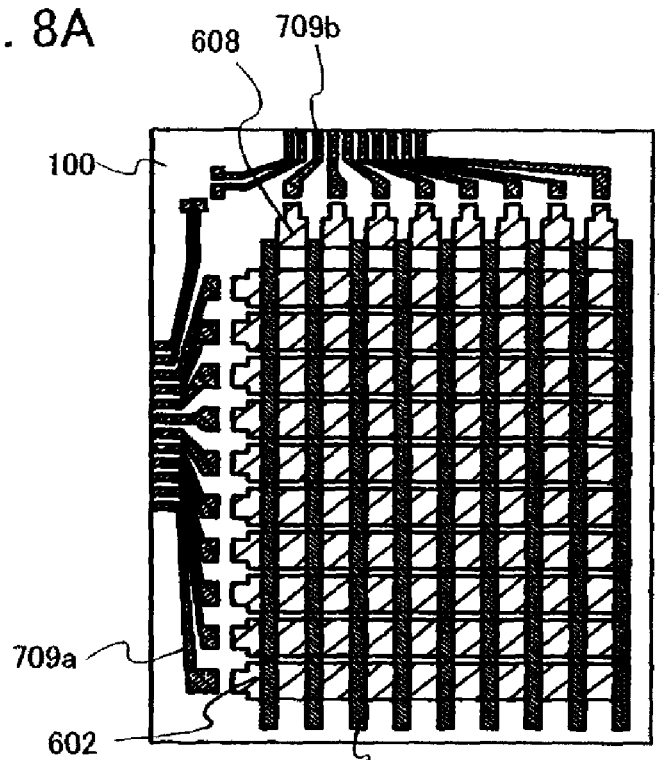
FIGS. 8A and 8B are top-view diagrams used to describe a structure of a semiconductor device of the present invention.

In addition, in FIG. 7, an example is shown in which no driver circuit is provided over the substrate; however, an example of a manufacturing method for a light-emitting module in which an IC chip that has a driver circuit is mounted will be described hereinafter using FIGS. 8A and 8B.

First, over the substrate 100, as in Embodiment Mode 1, a molybdenum film, a molybdenum oxide film, and an insulating film are formed. Over this insulating film, the scanning line 602 (which also functions as an anode) that has a stacked-layer structure, where the lower layer is formed of a metal film that can reflect light and the upper layer is formed of a transparent oxide conductive film, is formed. Simultaneously, the connecting wirings 608, 709a, and 709b and input terminals are formed.

Next, a partition wall that has openings, with each opening corresponding to a pixel, is provided. Then, over the partition wall that has openings (which is not shown in the diagrams), the plurality of the mutually parallel reverse taper partition walls 604 is formed to intersect with the scanning lines 602. A top-view diagram of what is obtained after the steps outlined above have been completed is shown in FIG. 8A.

Figure 8B:
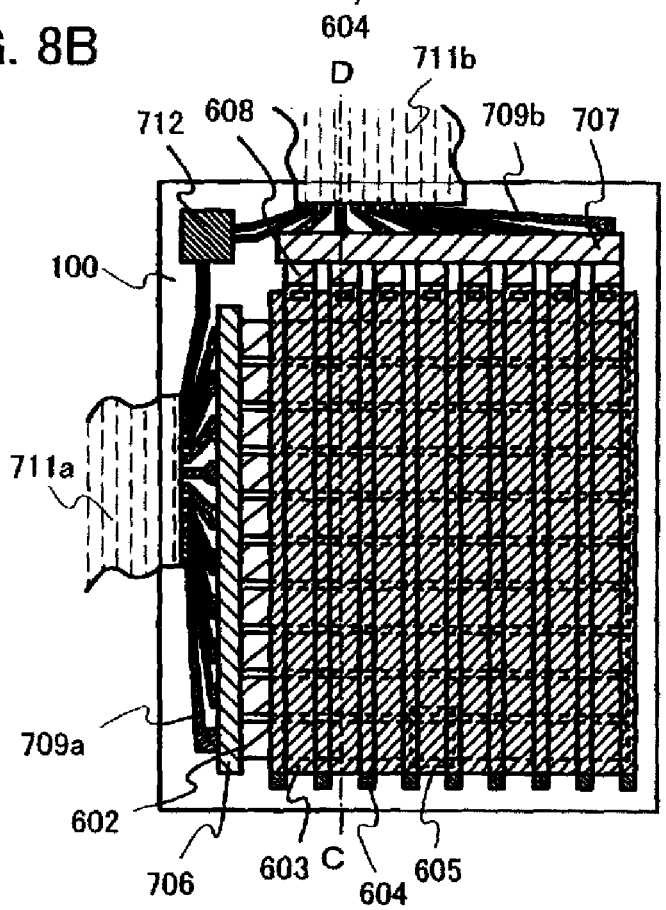

Subsequently, the stacked-layer film that includes a light-emitting layer and the transparent conductive film being formed and stacked, one over the other, are separated into a plurality of electrically independent regions as shown in FIG. 8B, and the stacked-layer film that includes a light-emitting layers and the data lines 603, which are made from a transparent conductive film, are formed. The data lines 603 that are made from a transparent conductive film are mutually parallel striped-shaped electrodes that extend in a direction of intersection with the scanning lines 602.

Next, in a region in the periphery (outer side) of a pixel portion, an IC 706 on the scanning line side and an IC 707 on the data line side that each have a driver circuit that is used to transmit a variety of signals to the pixel portion are each mounted by use of a COG method. TCP and wire bonding methods may be used as mounting techniques, in addition to the COG method, to mount the ICs in a region in the periphery (outer side) of the pixel portion. TCP is a method in which an IC is mounted onto a TAB tape, where a TAB tape is connected to a wiring on an element formation substrate and an IC is mounted onto the TAB tape. The IC 706 on the scanning line side and the IC 707 on the data line side may be ICs formed using a silicon substrate, or they may be driver circuits formed using thin film transistors over a glass substrate, a quartz substrate, or a plastic substrate. In addition, an example is shown in which one IC is provided on one side; however, the structure may be one in which a plurality of ICs, divided up into individual parts, is provided on one side.

It is to be noted that each of the data lines 603 is electrically connected to one of the connecting wirings 608 at the edge of the wiring, and each of the connecting wirings is connected to the IC 707 on the data line side. This is because forming the IC 707 on the data line side over the reverse taper partition walls 604 is difficult.

The IC 706 on the scanning line side, as in the structure described above, is connected to an FPC 711*a* via the connecting wiring 709*a*. Furthermore, the IC 707 on the data line side is connected to an FPC 711*b* via the connecting wiring 709*b*.

Moreover, integration can be achieved by implementation of an IC chip 712 (a memory chip, a CPU chip, a power supply circuit chip, or the like).

Next, a flexible substrate is attached using an adhesive layer so as to cover the IC chip 712.

Figure 9:
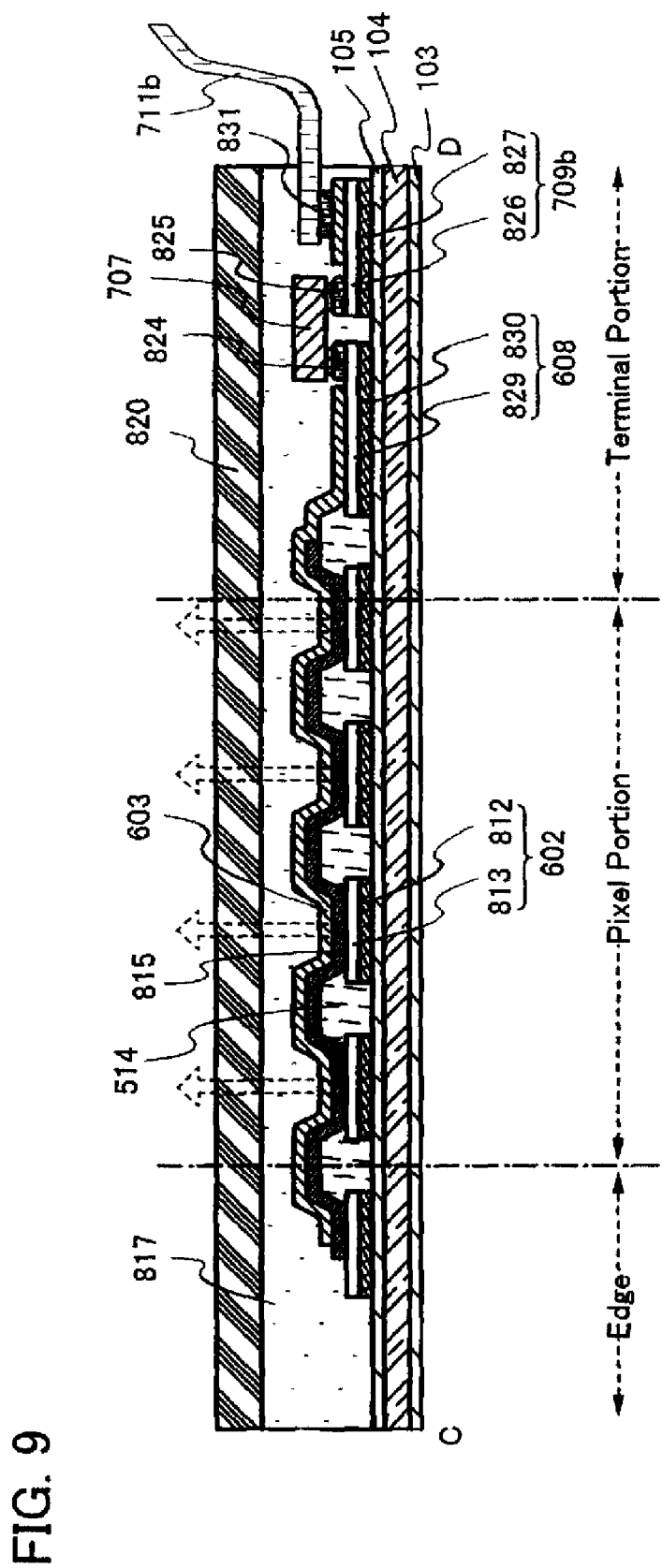
FIG. 9 is a cross-sectional-view diagram used to describe a structure of a semiconductor device of the present invention.

Next, the light-emitting element is separated from the substrate 100. It is to be noted that, after the light-emitting element is separated from the substrate 100, the nonmetal inorganic film 103 may be removed, as necessary. An example of the structure of a cross section at this time taken along a dotted line C-D in FIG. 8B is shown in FIG. 9.

The scanning line 602 is formed as a two-layer stacked layer structure, where a lower layer 812 is formed of a metal film that can reflect light and an upper layer 813 is formed of a transparent oxide conductive film. For the upper layer 813, it is preferable that a conductive film that has a high work function be used; in addition to indium tin oxide (ITO), for example, a film that contains a transparent conductive material such as indium tin oxide containing elemental Si, indium zinc oxide (IZO) in which zinc oxide (ZnO) is mixed into indium oxide, or the like or a compound of a combination of any of these materials can be used. In addition, for the lower layer 812, an Ag film, an Al film, or an Al alloy film is used.

The partition wall 514 that is used in order to make adjacent scanning lines be insulated from each other is formed of a resin, and regions enclosed by the partition wall all come to have the same area with respect to light-emitting regions.

The data lines 603 (cathodes) and the scanning lines 602 (anodes) are formed so as to intersect with each other. The data lines (cathodes) 603 are formed using a transparent conductive film such as a film of ITO, indium tin oxide containing elemental Si, indium zinc oxide (IZO) in which zinc oxide (ZnO) is mixed into indium oxide, or the like. Because the light-emitting device of the present embodiment mode is an example of a top-emission light-emitting device in which emitted light passes through a flexible substrate 820, that the data lines 603 are transparent is important.

Furthermore, the flexible substrate 820 is attached to a pixel portion, in which each of a plurality of light-emitting elements is arranged at a point of intersection between a scanning line and a data line that sandwich a stacked-layer film 815 that has a light-emitting layer; a terminal portion; and a peripheral portion, by an adhesive layer 817. For the adhesive layer 817, a UV curable resin, a thermally curable resin, a silicone resin, an epoxy resin, an acrylic resin, a polyimide resin, a phenolic resin, polyvinyl chloride (PVC), polyvinyl butyral (PVB), or ethylene vinyl acetate (EVA) can be used.

The connection wiring 709*b* is formed in the terminal portion, and the FPC 711*b* (a flexible printed circuit board) that is connected to an external circuit is attached to this portion. The connection wiring 709*b* is formed of stacked layers of a metal film 827 that reflects light, a transparent oxide conductive film 826, and an oxide conductive film that extends from the second electrodes; however, there are no limitations, in particular, on the structure of the connection wiring 709*b*.

For the method by which the FPC 711*b* is mounted to the terminal portion, a connection method that uses an anisotropic conductive material or a metal bump or a wire bonding method can be employed. In FIG. 9, connection of the FPC 711*b* is performed using an anisotropic conductive adhesive 831.

In addition, the IC 707 on the data line side that has a driver circuit that is used to transmit a variety of signals to the pixel portion is electrically connected to the periphery of the pixel portion by anisotropic conductive materials 824 and 825. Moreover, in order to form a pixel portion corresponding to color display of XGA class, there need to be 3072 lines for the number of data lines, and there need to be 768 lines on the scanning line side. The data lines and scanning lines formed at these kinds of numbers are divided up at an edge of the pixel portion for every number of blocks, and leader line wirings are formed and lined up to match the pitch of output terminals of the IC.

By the above steps, a light-emitting module that is sealed by the organic compound film 104, on the outer side of which is formed the nonmetal inorganic film 103, and the flexible substrate 820 and in which an IC is mounted can be fabricated. Because thermocompression bonding is performed to mount an IC onto a light-emitting device, it is preferable that mounting of the IC by thermocompression bonding be performed on a hard substrate. By the present invention, separation is performed after an IC has been mounted in the light-emitting device, and the light-emitting device can be fabricated.

Embodiment Mode 4

In the present embodiment mode, a mode of fabrication of a semiconductor device that functions as a wireless chip will be shown. The semiconductor device shown in the present embodiment mode is a device by which reading and writing of data can be done contactlessly. Data transmission types are roughly divided up into three types: an electromagnetic coupling method by which each of a pair of coils is arranged opposite from the other and data is communicated by mutual inductance, an electromagnetic induction method by which data is communicated by induction field, and an electromagnetic wave method in which data is communicated using electromagnetic waves. Any of these methods may be used.

Furthermore, there are two ways in which an antenna used in the transmission of data is provided. One way is to provide a terminal portion in a semiconductor component in which a plurality of elements and memory elements (hereinafter, this kind of component will be referred to as an element substrate) is provided and to connect an antenna that is formed over a different substrate to the terminal portion. The other way is to have an antenna be built onto an element substrate in which are provided a plurality of semiconductor elements, passive elements, and the like.

A fabrication method for when an antenna is provided where the antenna that is provided over a separate substrate is connected to a terminal portion of an element substrate will be presented hereinafter.

Figure 10A:
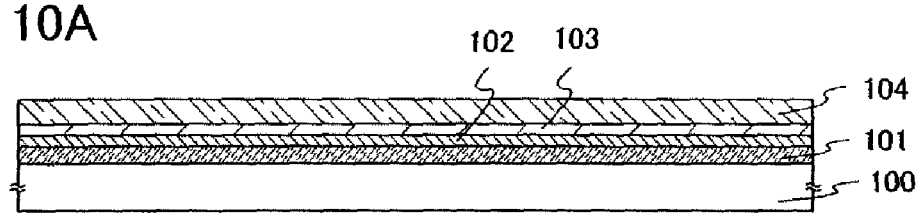
FIGS. 10A to 10C are cross-sectional-view diagrams and FIG. 10D is a perspective-view diagram that are used to describe a manufacturing method for a semiconductor device of the present invention.

First, as in Embodiment Mode 1, as shown in FIG. 10A, the molybdenum film 101 is formed over the substrate 100, the molybdenum oxide film 102 is formed over the molybdenum film 101, the nonmetal inorganic film 103 is formed over the molybdenum oxide film 102, and the organic compound film 104 is formed over the nonmetal inorganic film 103. It is to be noted that, as shown in Embodiment Mode 1, the inorganic insulating film 105 may be formed over the organic compound film 104, if necessary.

Figure 10B:
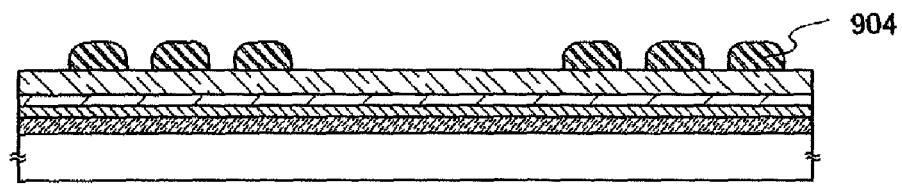

Next, as shown in FIG. 10B, a conductive layer 904 that functions as an antenna is formed over the organic compound film 104. The conductive layer 904 that functions as an antenna is formed of droplets that have or a paste that has a conductor such as gold, silver, copper, or the like, where the droplets are or the paste is discharged by a liquid droplet discharge method (an inkjet printing method, a dispenser method, or the like) and dried and baked. By formation of conductive layer 904 that functions as an antenna by a liquid droplet discharge method, a reduction in the number of process steps is possible, and a reduction in costs is possible, as well. In addition, the conductive layer 904 may also be formed by use of a screen printing method. When a screen printing method is used, for a material for the conductive layer 904 that functions as an antenna, a conductive paste in which conductive particles, each with a diameter of from several nanometers to several tens of micrometers, are dissolved in or dispersed throughout an organic resin is printed as selected. For the conductive particles, metal particles of one or more of silver (Ag), gold (Au), copper (Cu), nickel (Ni), platinum (Pt), palladium (Pd), tantalum (Ta), molybdenum (Mo), titanium (Ti), and the like; fine particles of a silver halide; or dispersive nanoparticles of any of these can be used. Moreover, for the organic resin that is contained in the conductive paste, one or more organic resins selected from organic resins that function as binders, solvents, dispersants, or coating materials of metal particles can be used. Typically, organic resins such as epoxy resins, silicone resins, and the like can be given. Furthermore, in formation of the conductive layer 904, it is preferable that the conductive paste be baked after being extruded. Additionally, particles containing solder or lead-free solder as the main component may be used, and in this case, it is preferable that fine particles with a diameter of 20 μm or less be used. Solder and lead-free solder both have an advantage in that they are inexpensive. In addition to the materials given above, a ceramic, ferrite, or the like may be applied for the antenna, as well.

When the antenna is fabricated using a screen printing method or a liquid droplet discharge method, after formation of the antenna into a desired shape, baking is performed. The baking temperature is from 200° C. to 300° C. Baking at a temperature less than 200° C. is also possible; however, when the baking temperature is less than 200° C., there is a risk that the conductivity of the antenna cannot be maintained or that the communication distance for the antenna will become too short. In consideration of these points, it is preferable that, after the antenna is formed over a separate substrate, namely, a substrate that can withstand high temperatures, the antenna be separated from the substrate and connected to the element substrate.

Moreover, the antenna may be formed using gravure printing or the like in addition to being formed by a screen printing method, as well, or the antenna can be formed of a conductive material using a plating method or the like.

Figure 10C:
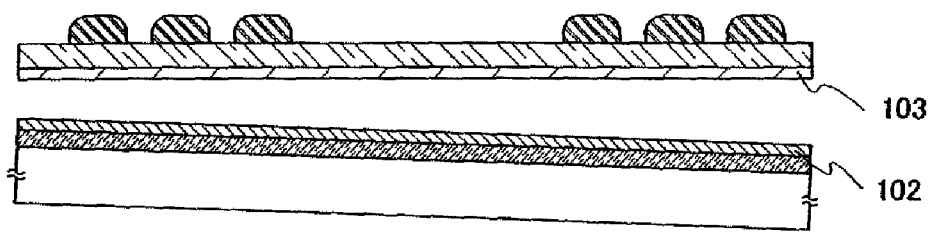

Next, separation is performed, as shown in FIG. 10C, to separate the nonmetal inorganic film 103 from the substrate 100. Because separation can be performed with the addition of relatively little force in a separation method of the present invention that uses a molybdenum oxide film, yield can be improved. In addition, because the separation method of the present invention uses separation in the vicinity of a molybdenum oxide film by the addition of relatively little force only without any need for heat treatment at a temperature of 500° C. or more, changes in the shape of the organic compound film 104 occurring while separation is being performed can be suppressed, and the amount of damage that the conductive layer 904 receives can be reduced. It is to be noted that, after performance of the separation step, the nonmetal inorganic film 103 may be removed, as necessary.

Figure 10D:
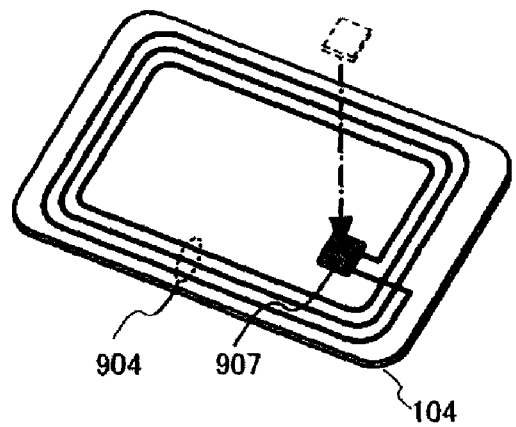
Figure 11A:
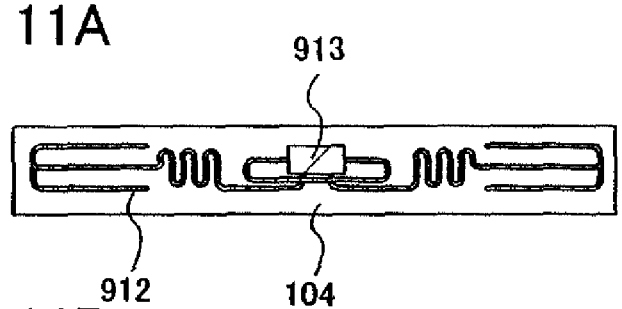
FIGS. 11A to 11D are top-view diagrams used to describe shapes of antennas that can be applied to the present invention.
Figure 11B:
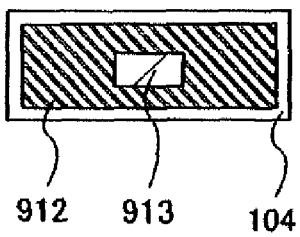
Figure 11C:
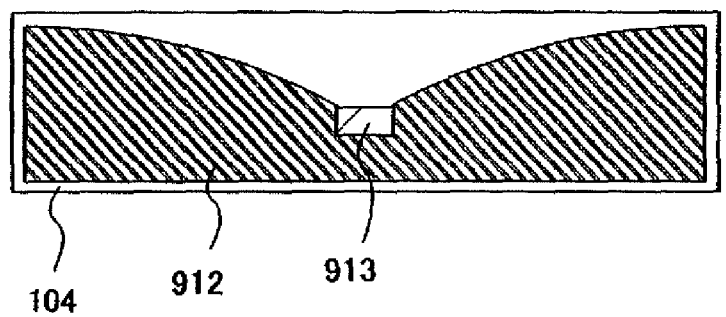
Figure 11D:
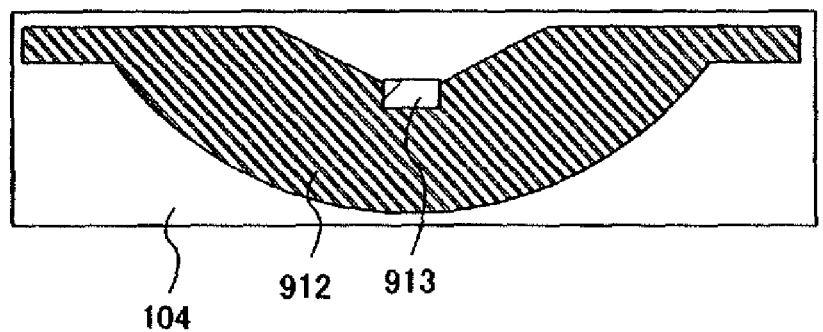

Next, as shown in FIG. 10D, an element substrate 907 is placed over the surface of the organic compound film 104 over which the compound layer 904 is provided. By compression bonding using an anisotropic conductive material, electrical continuity between a terminal portion of the element substrate and the conductive layer 904 is achieved.

It is to be noted that, in FIGS. 10A to 10D, after a stacked-layer body that includes the conductive layer 904 is separated from the substrate 100, the conductive layer 904 and the element substrate 907 are connected to each other; however, the stacked-layer body that includes the conductive layer 904 may instead be separated from the substrate 100 after the conductive layer 904 is baked and connected to the element substrate 907.

Moreover, when a plurality of conductive layers that each functions as an antenna are formed over the stacked-layer body that includes the conductive layer 904, after the stacked-layer body is divided up and a plurality of stacked-layer bodies that each has the conductive layer 904 that functions as an antenna is formed, the element substrate may be connected to the conductive layer 904.

Furthermore, in FIG. 10D, an example is shown in which the element substrate 907 has a small area compared to that of the organic compound film 104; however, the present invention is not limited to this case, in particular, and the element substrate may be formed to have approximately the same area as that of the organic compound film 104, or it may be formed to have a larger area than that of the organic compound film 104.

By the steps given above, a semiconductor device that functions as an IC tag can be completed. The semiconductor device is thin and has flexibility. Moreover, by provision of an organic compound film between a molybdenum oxide film and a conductive layer that functions as an antenna, the organic compound film can be made to function as a support of the semiconductor device. For this reason, a support substrate used to support the semiconductor device need not be formed unnecessarily, and costs can be reduced.

It is to be noted that, lastly, to protect the element substrate 907, the organic compound film 104 and another flexible substrate may be attached so as to cover the element substrate 907.

Next, a method for fabrication of a semiconductor device that functions as a wireless chip where an antenna is formed over an element substrate in which an element and a memory element are provided will be described using FIGS. 3A to 3D.

Figure 3A:
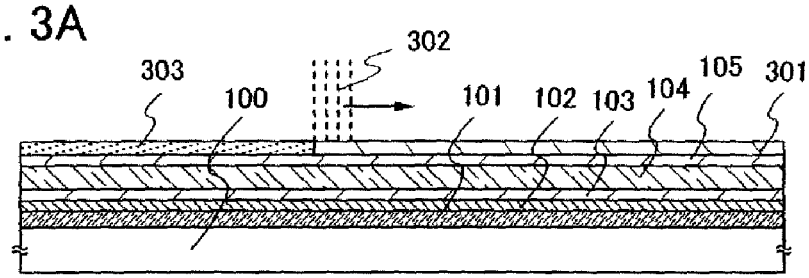
FIGS. 3A to 3D are cross-sectional-view diagrams used to describe a manufacturing method for a semiconductor device of the present invention.
Figure 3B:
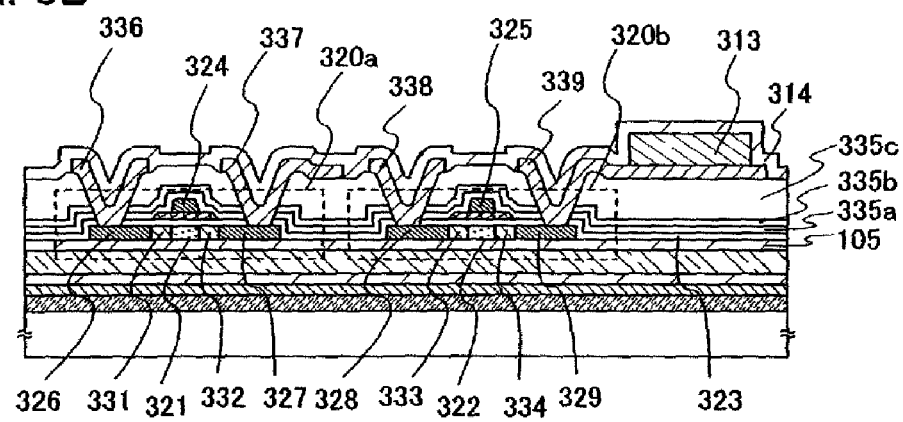

As in Embodiment Mode 1, as shown in FIG. 3A, the molybdenum film 101 is formed over the substrate 100, the molybdenum oxide film 102 is formed over the molybdenum film 101, the nonmetal inorganic film 103 is formed over the molybdenum oxide film 102, the organic compound film 104 is formed over the nonmetal inorganic film 103, and the inorganic insulating film 105 is formed over the organic compound film 104.

Next, an amorphous semiconductor film is formed over the inorganic insulating film 105. The amorphous semiconductor film is formed in the same way as the amorphous semiconductor film 108 shown in Embodiment Mode 1 is formed. Here, an amorphous silicon film is formed at a thickness of greater than or equal to 10 nm and less than or equal to 100 nm, preferably, greater than or equal to 20 nm and less than or equal to 80 nm, by a plasma CVD method.

Next, the amorphous semiconductor film is scanned with a laser beam 302, and a crystalline semiconductor film is formed. In FIG. 3A, an example is shown in which a crystalline semiconductor film 303 is formed by a laser annealing method with which an amorphous semiconductor film 301 is scanned with a laser beam.

When crystallization is performed using a laser annealing method, a pulsed laser or continuous wave laser can be used. Furthermore, the laser wavelength is set to be within the visible to ultraviolet light region (wavelength of 800 nm or less) of the electromagnetic spectrum, preferably within the ultraviolet light region (wavelength of 400 nm or less), so that the laser beam is absorbed by the semiconductor film effectively. For a laser oscillator, an excimer laser oscillator of KrF, ArF, XeCl, XeF, or the like; a gas laser oscillator of $N_2$, He, He—Cd, Ar, He—Ne, HF, or the like; a solid-state laser oscillator using a crystal such as YAG, $GdVO_4$, $YVO_4$, YLF, $YAlO_3$, $ScO_3$, $Lu_2O_3$, $Y_2O_3$, or the like that is doped with Cr, Nd, Er, Ho, Ce, Co, Ti, Yb, or Tm; a metal vapor laser oscillator such as a helium-cadmium oscillator or the like; or the like can be used. It is to be noted that, with a solid-state laser oscillator, it is preferable that the third to fifth harmonics of a fundamental wave be applied. A laser beam is focused by an optical system and used; for example, the laser beam is processed into a linear form, and laser annealing is performed. Laser annealing conditions are selected as appropriate by a practitioner; for one example of the laser annealing conditions, the laser pulse repetition rate is set to 30 Hz, and the laser energy density is set to from 100 $mJ/cm^2$ to 500 $mJ/cm^2$ (typically, from 300 $mJ/cm^2$ to 400 $mJ/cm^2$). Then, the linear beam is passed over the entire surface of a substrate to irradiate the substrate, and laser irradiation is performed with the superposition percentage (overlap percentage) of the linear beams at this time set to be from 80% to 98%. In this way, a crystalline semiconductor film can be formed.

Here, a crystalline silicon film is formed by irradiation of an amorphous silicon film with an excimer laser beam.

It is to be noted that, in order to prevent the ejection of hydrogen from the amorphous semiconductor film, before an amorphous silicon film is irradiated with a laser beam, it is preferable that the amorphous silicon film be irradiated with a laser beam of lower energy than the energy of the laser beam used for crystallization in order to remove hydrogen that is in the amorphous silicon film.

Next, the crystalline semiconductor film 303 is etched as selected, and semiconductor layers 321 and 322 are formed. Here, for an etching method of the crystalline semiconductor film, dry etching, wet etching, and the like can be used. Here, after a resist is applied over the crystalline semiconductor film, exposure to light and development are carried out, and a resist mask is formed. Next, the crystalline semiconductor film is etched as selected by dry etching using the resist mask where the flow ratio of $SF_6:O_2$ is set to be 4:15. After the crystalline semiconductor film is etched, the resist mask is removed.

Next, a gate insulating film 323 is formed over the semiconductor layers 321 and 322. The gate insulating film 323 is formed as a single layer or as a stacked-layer structure of silicon nitride, silicon nitride that contains oxygen, silicon oxide, silicon oxide that contains nitrogen, or the like. Here, the gate insulating film 323 is formed of silicon oxide that contains nitrogen at a thickness of 115 nm by a plasma CVD method.

Next, gate electrodes 324 and 325 are formed. The gate electrodes 324 and 325 can be formed of a metal or of a polycrystalline semiconductor that is doped with an impurity of one conductivity type. When a metal is used, tungsten (W), molybdenum (Mo), titanium (Ti), tantalum (Ta), aluminum (Al), or the like can be used. Furthermore, a metal nitride where a metal has been nitrided can be used. Alternatively, the structure of each of the gate electrodes 324 and 325 may be set to be a structure in which a first layer formed from the metal nitride and a second layer formed from the metal are stacked together. In addition, the gate electrodes 324 and 325 can be formed using a paste that contains fine particles where the paste that contains fine particles is extruded onto the gate insulating film by a liquid droplet discharge method, dried, and baked. Moreover, the gate electrodes 324 and 325 can be formed using a paste that contains fine particles where the paste that contains fine particles is printed onto the gate insulating film by a printing method, dried, and baked. For typical examples for the fine particles, the fine particles may be fine particles whose main component is set to be any of gold, copper, an alloy of gold and silver, an alloy of gold and copper, an alloy of silver and copper, or an alloy of gold, silver, and copper. Here, after a tantalum nitride film with a film thickness of 30 nm and a tungsten film with a thickness of 370 nm are formed over the gate insulating film 323 by a sputtering method, the tantalum nitride film and the tungsten film are etched as selected using a resist mask that is formed by a photolithography process, and the gate electrodes 324 and 325 that have a shape where the edge of the tantalum nitride film projects past the edge of the tungsten film are formed.

Next, the gate electrodes 324 and 325 are used as masks, the semiconductor layers 321 and 322 are doped with an impurity element imparting n-type conductivity and an impurity element imparting p-type conductivity, respectively, and source regions and drain regions 326 to 329 are formed. Furthermore, low-concentration impurity regions 331 to 334 overlapping with part of the gate electrodes 324 and 325 are formed. Here, the source regions and drain regions 326 to 329 and the low-concentration impurity regions 331 to 334 are doped with phosphorus, which is an impurity element that imparts n-type conductivity.

After doping is performed, the impurity element with which the semiconductor film has been doped may be activated. Here, the impurity may be activated by irradiation with a laser beam. By the above steps, thin film transistors 320*a* and 320*b* are formed. It is to be noted that n-channel thin film transistors are formed for the thin film transistors 320*a* and 320*b*. Furthermore, although not shown in the diagrams, a driver circuit is formed of a p-channel thin film transistor and an n-channel thin film transistor.

Next, an interlayer insulating film used to insulate the gate electrodes of the thin film transistors 320*a* and 320*b* and wirings is formed. Here, a silicon oxide film 335*a*, a silicon nitride film 335*b*, and a silicon oxide film 335*c* are stacked together to form the interlayer insulating film. In addition, over the silicon oxide film 335*c*, which is one part of the interlayer insulating film, wirings 336 to 339 used to connect to the source regions and drain regions 326 to 329 of the thin film transistors 320*a* and 320*b* are formed. Here, after a Ti film with a thickness of 100 nm, an Al film with a thickness of 333 nm, and a Ti film with a thickness of 100 nm are formed consecutively by a sputtering method, the films are etched as selected using a resist mask that is formed by a photolithography process, and the wirings 336 to 339 are formed. After the wirings 336 to 339 are formed, the resist mask is removed.

Subsequently, a conductive layer 313 that functions as an antenna is formed over the wiring 339 that is connected to the thin film transistor 320*b*. The conductive layer 313 that functions as an antenna can be formed in the same way as the conductive layer 904 that functions as an antenna shown in FIGS. 10A to 10D is formed. Alternatively, the conductive layer 313 that functions as an antenna can be formed where, after a conductive layer is formed by a sputtering method, the conductive layer is etched as selected using a mask that is formed by a photolithography process to form the conductive layer 313 that functions as an antenna.

After the conductive layer 313 that functions as an antenna is formed, a passivation film 314 may be formed over the conductive layer 313 that functions as an antenna and the interlayer insulating film. By formation of the passivation film 314, contamination of the conductive layer 313 that functions as an antenna and the thin film transistors 320*a* and 320*b* with moisture, oxygen, or impurities from external can be avoided. The passivation film 314 is formed of silicon nitride, silicon oxide, silicon nitride oxide, silicon oxynitride, diamond-like carbon (DLC), nitrogen carbide, or the like.

Figure 3C:
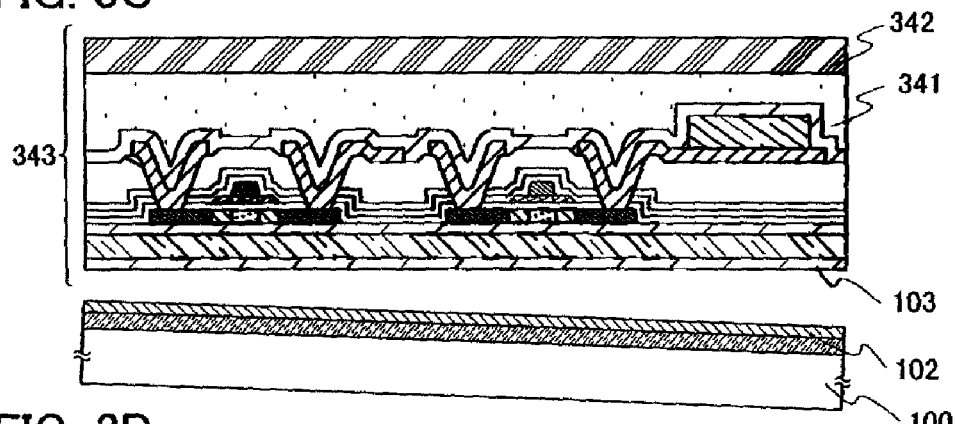
Figure 3D:
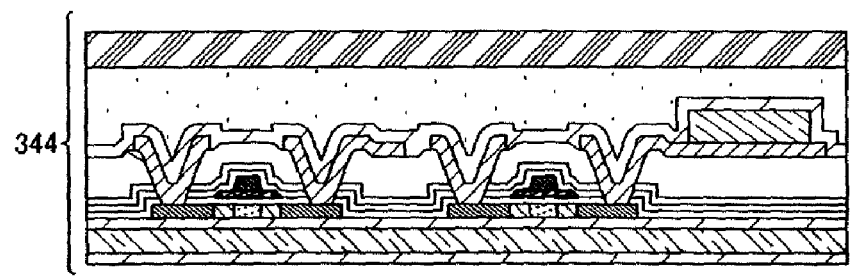

Next, as shown in FIG. 3C, a flexible substrate 342 is affixed over the passivation film 314 using an adhesive layer 341.

Next, a stacked-layer body 343 that includes the nonmetal inorganic film 103, the organic compound film 104, the thin film transistors 320*a* and 320*b*, the conductive layer 313 that functions as an antenna and the flexible substrate 342 is separated from the substrate 100. Because the molybdenum oxide film is brittle, separation of a stacked-layer body from a substrate can be performed with relatively little force. It is to be noted that, after the stacked-layer body 343 is separated from the substrate 100, the nonmetal inorganic film 103 may be removed, as necessary.

It is to be noted that, when a plurality of semiconductor devices is included in the stacked-layer body 343 that includes the nonmetal inorganic film 103, the organic compound film 104, the thin film transistors 320*a* and 320*b*, the conductive layer 313 that functions as an antenna and the flexible substrate 342, the stacked-layer body may be divided up and the plurality of semiconductor devices cut apart. By this kind of step, a plurality of semiconductor devices can be fabricated by a single separation step.

By the steps given above, a semiconductor device 344 that functions as an IC tag can be completed. The semiconductor device of the present embodiment mode is thin and has flexibility. Moreover, by provision of an organic compound film between a molybdenum oxide film and a thin film transistor, the organic compound film can be made to function as a support of the semiconductor device. For this reason, a support substrate used to support the semiconductor device need not be formed unnecessarily, and costs can be reduced.

Here, for a transmission method for signals in the semiconductor device, an electromagnetic coupling method or an electromagnetic induction method (for example, frequency in the 13.56 MHz band) is applied. Because electromagnetic induction by changes in magnetic field density is used, in FIG. 10D, the upper surface of a conductive layer that functions as an antenna is formed as a circular shape (for example, as a loop antenna) or a coil shape (for example, as a spiral antenna); however, there are no particular limitations on the shape into which the conductive layer is formed.

Moreover, for a transmission method for signals in the semiconductor device, a microwave (for example, waves with frequencies in the UHF band (from 860 MHz to 960 MHz), in the 2.45 GHz, or the like) method can be applied. In this case, the shape, such as the length and the like, of the conductive layer that functions as an antenna may be set as appropriate in consideration of the wavelength of the electromagnetic waves used in the transmission of signals. Examples of a chip-form semiconductor device 913 that has a conductive layer 912 that functions as an antenna and an integrated circuit that are formed over the organic compound film 104 are shown in FIGS. 11A to 11D. For example, the shape of the upper surface of a conductive layer that functions as an antenna can be formed into a linear shape (for example, as a dipole antenna (referring to FIG. 11A)), a planar shape (for example, as a patch antenna (referring to FIG. 11B), a ribbon shape (referring to FIGS. 11C and 11D), or the like. In addition, the shape of the conductive layer that functions as an antenna is not limited to being a linear shape but may be provided as a curved-line shape or a serpentine shape or as a shape that is a combination of any of these shapes, in consideration of the wavelength of the electromagnetic waves.

Figure 12A:
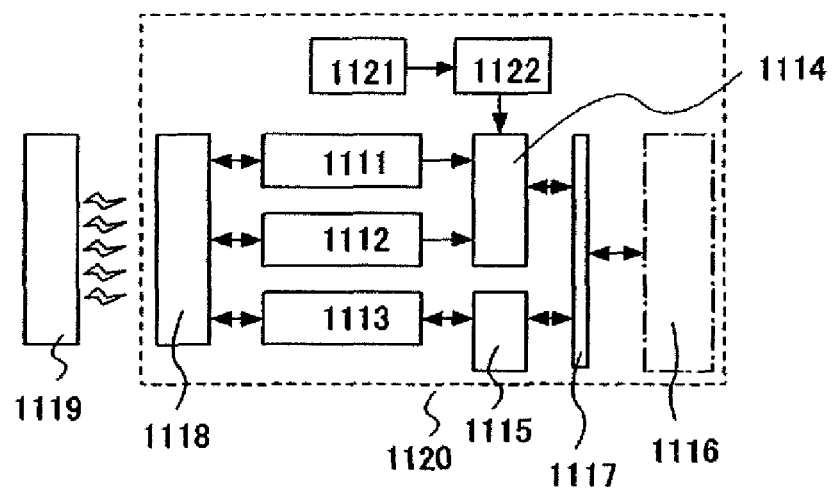
FIG. 12A is a diagram used to describe a structure of a semiconductor device of the present invention.

Furthermore, a structure of a semiconductor device obtained by the above steps will be described with reference to FIG. 12A. As shown in FIG. 12A, a semiconductor device 1120 obtained by use of the present invention has a function by which data can be communicated by non-contact and has a power supply circuit 1111, a clock generator circuit 1112, a data demodulation or modulation circuit 1113, a controller circuit 1114 that is used to control other circuits, an interface circuit 1115, a memory circuit 1116, a data bus 1117, an antenna 1118, a sensor 1121, and a sensor circuit 1122.

The power supply circuit 1111 is a circuit that generates a variety of power supply signals supplied to each internal circuit of the semiconductor device 1120 based on alternating current signals input from the antenna 1118. The clock generator circuit 1112 is a circuit that generates a variety of clock signals that are supplied to each internal circuit of the semiconductor device 1120 based on alternating current signals input from the antenna 1118. The data demodulation or modulation circuit 1113 has a function used to demodulate or modulate data exchanged with a communications device 1119. The controller circuit 1114 has a function used to control the memory circuit 1116. The antenna 1118 has a function used to transmit and receive electromagnetic waves. The communications device 1119 communicates with and controls the semiconductor device and controls the processing of data thereof. It is to be noted that the semiconductor device is not limited to having the above structure; for example, the structure may be one that includes additional components such as a power supply voltage limiter circuit or hardware used exclusively for cryptography.

The memory circuit 1116 has a memory element in which an organic compound layer or a phase-change layer is interposed between a pair of conductive layers. It is to be noted that the memory circuit 1116 may have only a memory element in which an organic compound layer or a phase-change layer is interposed between a pair of conductive layers, or the memory circuit 1116 may have a memory circuit that has another structure. A memory circuit with another kind of structure corresponds to one or more of any of the following: a DRAM circuit, an SRAM circuit, an FeRAM circuit, a mask ROM circuit, a PROM circuit, an EPROM circuit, an EEPROM circuit, or a flash memory circuit.

The sensor 1121 is formed of a semiconductor element such as a resistive element, a capacitive-coupling element, an inductive-coupling element, a photovoltaic element, a photoelectric element, a thermoelectromotive element, a transistor, a thermistor, a diode, or the like. The sensor circuit 1122 detects changes in impedance, reactance, inductance, voltage, or current; converts signals from analog to digital (A/D conversion); and outputs signals to the controller circuit 1114.

Furthermore, the present embodiment mode can be freely combined with Embodiment Mode 1 or Embodiment Mode 2. For example, an element substrate, which has been separated from a substrate, in which an integrated circuit formed using thin film transistors obtained by use of Embodiment Mode 1 or Embodiment Mode 2 is formed and a flexible substrate over which an antenna obtained by use of the present embodiment mode is provided are attached together, and electrical connectivity is achieved therebetween.

By the present invention, a semiconductor device that functions as an IC tag that has a processor circuit (hereinafter, these types of IC tags will also be referred to as IC chips, processor chips, wireless chips, wireless processors, wireless memory chips, and wireless tags) can be formed. The range of applications for a semiconductor device obtained by use of the present invention covers a wide range; for example, the semiconductor device can be provided and used in articles such as paper money, coins, securities, certificates, unregistered bonds, packaging containers, books, storage media, personal belongings, vehicles, food products, clothing, healthcare products, household goods, medicines, electronic devices, and the like.

Figure 13A:
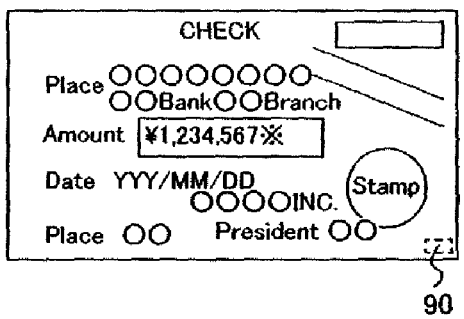
FIGS. 13A to 13G are diagrams each used to describe an application of a semiconductor device of the present invention.
Figure 13B:
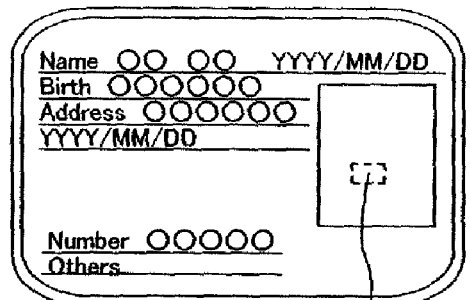
Figure 13C:
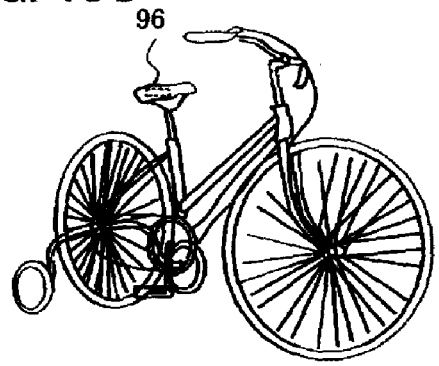
Figure 13D:
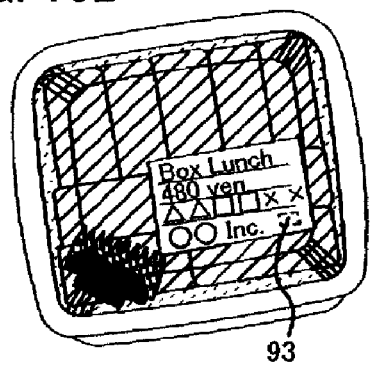
Figure 13E:
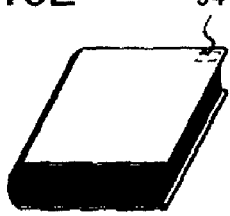
Figure 13F:
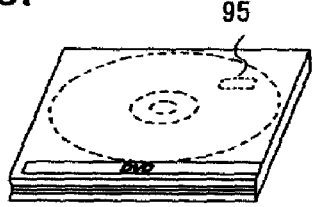
Figure 13G:

Paper money and coins are money that circulates the market and include objects (cash vouchers) that are used in the same way as currency within a limited region, memorial coins, and the like. Securities refer to checks, bonds, promissory notes, and the like, and an IC tag 90 that has a processor circuit can be provided therewith (referring to FIG. 13A). Certificates refer to driver's licenses, residence certificates, and the like, and an IC tag 91 can be provided therewith (referring to FIG. 13B). Vehicles refer to wheeled vehicles such as bikes and the like, ships, and the like, and an IC tag 96 can be provided therewith (referring to FIG. 13C). Unregistered bonds refer to stamps, rice coupons, various kinds of gift vouchers, and the like. Packaging containers refer to wrapping paper for lunch boxes and the like, plastic bottles, and the like, and an IC tag 93 can be provided therewith (referring to FIG. 13D). Books refer to printed books, and an IC tag 94 can be provided therewith (referring to FIG. 13E). Storage media refer to DVDs, video tapes, and the like, and an IC tag 95 can be provided therewith (referring to FIG. 13F). Personal belongings refer to bags, eyeglasses, and the like, and an IC tag 97 can be provided therewith (referring to FIG. 13G). Food products refer to foods, beverages, and the like. Clothing refers to garments, footwear, and the like. Healthcare products refer to medical equipment, healthcare equipment, and the like. Household goods refer to furniture, lighting equipment, and the like. Medicines refer to pharmaceuticals, agrochemicals, and the like. Electronic devices refer to liquid crystal display devices, EL display devices, television devices (television sets, flat-screen television sets), cellular phones, and the like.

A semiconductor device obtained by use of the present invention is affixed to an article by being mounted to a printed circuit board, by being attached to a surface of the article, or by being embedded in the article. For example, for a book, the semiconductor device is embedded in the paper; for packaging made of an organic resin, the semiconductor device is embedded in the organic resin; the semiconductor device is affixed to each article. The semiconductor device of the present invention is one by which a small, thin, and lightweight semiconductor device is realized; therefore, even after the semiconductor device has been affixed to an article, the design characteristics of the article itself are not affected. In addition, by provision of the semiconductor device obtained by use of the present invention in paper money, coins, securities, unregistered bonds, certificates, and the like, an authentication function can be provided; if this authentication function is utilized, forgery can be prevented. Furthermore, by provision of the semiconductor device obtained by use of the present invention in packaging containers, storage media, personal belongings, food products, clothing, household goods, electronic devices, and the like, improvement in the efficiency of systems, such as inspection systems and the like, can be realized.

Figure 12B:
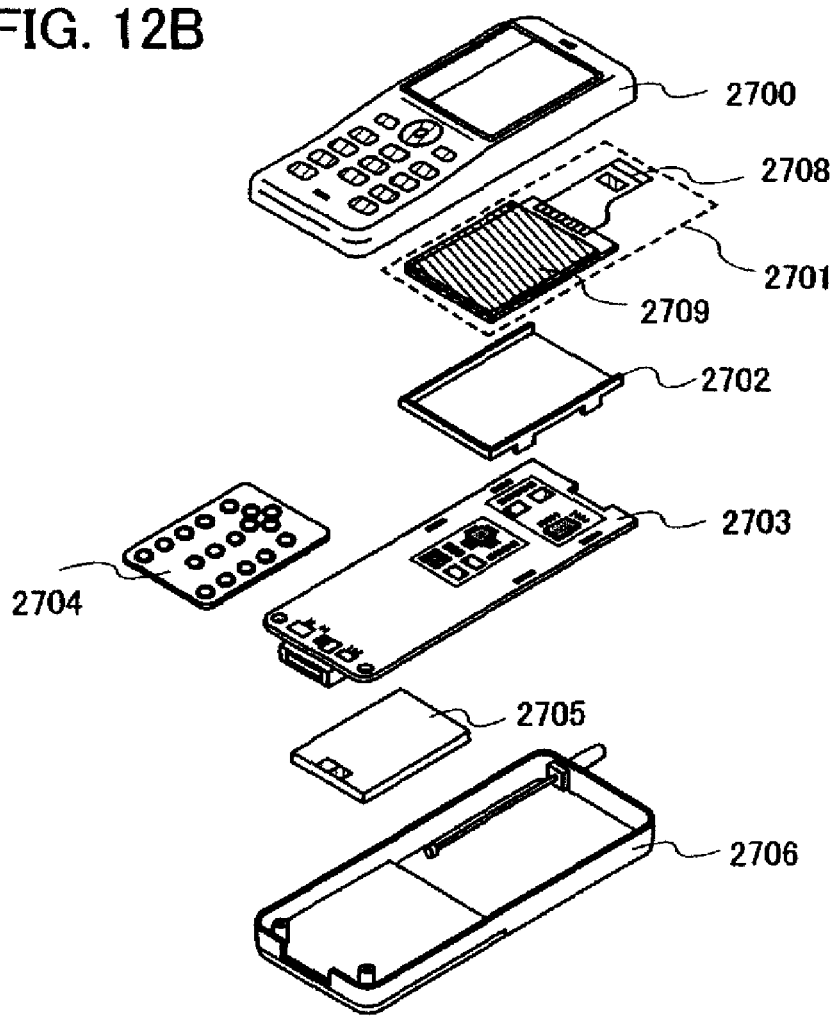
FIG. 12B is a diagram used to describe an example of an electronic device.

Next, one embodiment of an electronic device in which the semiconductor device obtained by use of the present invention is implemented will be explained with reference to diagrams. The example of an electronic device illustrated here is of a cellular telephone, which includes housings 2700 and 2706, a panel 2701, a housing 2702, a printed circuit board 2703, operation buttons 2704, and a battery 2705 (referring to FIG. 12B). The panel 2701 is implemented in the housing 2702 in such a way that it can be inserted or removed freely, and the printed circuit board 2703 is fitted to the housing 2702. The shape and dimensions of the housing 2702 are changed appropriately to conform to the shape and dimensions of the panel 2701 incorporated in the electronic device. A plurality of packaged semiconductor devices is mounted on the printed circuit board 2703, and out of the plurality of semiconductor devices, one can be used as a semiconductor device that is obtained by use of the present invention. The plurality of the semiconductor devices mounted on the printed circuit board 2703 functions as any of the following: a controller, a central processing unit (CPU), memory, a power supply circuit, an audio processing circuit, a transmitter-receiver circuit, or the like.

The panel 2701 is connected to the printed circuit board 2703 through a connective film 2708. The panel 2701, the housing 2702, and the printed circuit board 2703 are placed inside the housings 2700 and 2706 along with the operation buttons 2704 and the battery 2705. A pixel region 2709 included in the panel 2701 is positioned in such a way that it is visible through an aperture window provided in the housing 2700.

As described above, because a flexible substrate is used, the semiconductor device obtained by use of the present invention has the characteristics of being small in size, thin, and lightweight; by the aforementioned characteristics, limited space inside the housings 2700 and 2706 of the electronic device can be used effectively.

It is to be noted that the housings 2700 and 2706 indicate an example of the appearance and shape of a cellular telephone, but electronic devices of the present embodiment mode can be changed into various modes depending on the functions and intended use.

Embodiment Mode 5

Here, an example in which a semiconductor device that has a semiconductor element formed using an amorphous semiconductor film is fabricated will be described using FIGS. 4A to 4D. For semiconductor elements formed using amorphous semiconductor films, there are thin film transistors, diodes, resistive elements, and the like. Here, an example where a photoelectric element that is formed by use of a diode is used for the semiconductor element that is formed by use of an amorphous semiconductor film is shown.

Figure 4A:
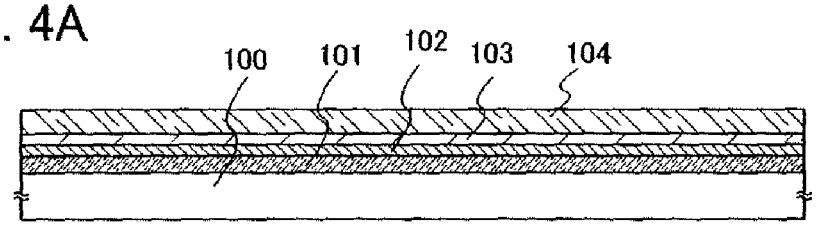
FIGS. 4A to 4D are cross-sectional-view diagrams used to describe a manufacturing method for a semiconductor device of the present invention.
Figure 4B:
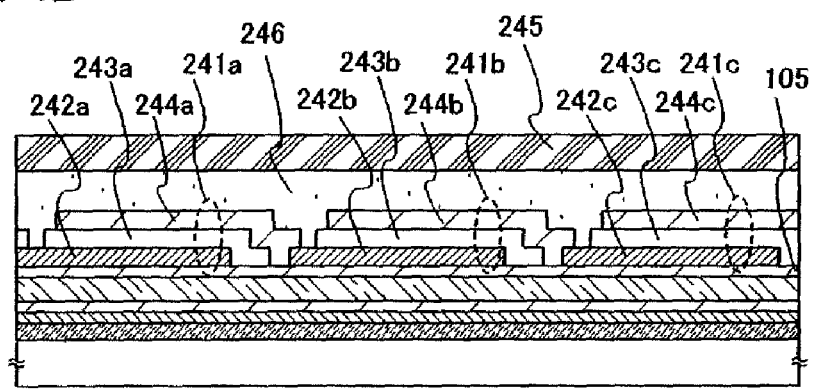
Figure 4C:
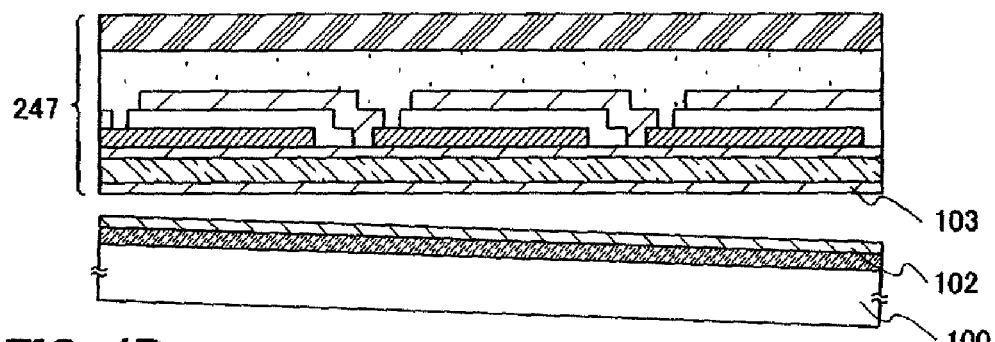
Figure 4D:
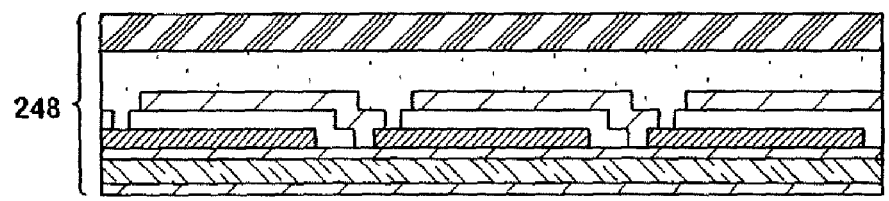

As in Embodiment Mode 1, the molybdenum film 101 is formed over the substrate 100, the molybdenum oxide film 102 is formed over the molybdenum film 101, the nonmetal inorganic film 103 is formed over the molybdenum oxide film 102, and the organic compound film 104 is formed over the nonmetal inorganic film 103. A cross-sectional process diagram of what is obtained after processes up to this stage have been completed is shown in FIG. 4A.

Next, the inorganic insulating film 105 is formed over the organic compound film 104, and first conductive layers 242a to 242c are formed over the inorganic insulating film 105.

Then, photoelectric layers 243a to 243c are formed so that a part of each of the first conductive layers 242a to 242c is exposed. Subsequently, second conductive layers 244a to 244c are formed over the photoelectric layers 243a to 243c as well as over the exposed parts of the first conductive layers 242a to 242c. Here, a photoelectric element 241a is made up of the first conductive layer 242a, the photoelectric layer 243a, and the second conductive layer 244a. In addition, a photoelectric element 241b is made up of the first conductive layer 242b, the photoelectric layer 243b, and the second conductive layer 244b. Furthermore, a photoelectric element 241c is made up of the first conductive layer 242c, the photoelectric layer 243c, and the second conductive layer 244c. It is to be noted that, in order that the photoelectric elements 241a to 241c be connected in series, the second conductive layer 244a of the photoelectric element 241a is formed so as to come into contact with the first conductive layer 242b of the second photoelectric element 241b. Moreover, the second conductive layer 244b of the photoelectric element 241b is formed so as to come into contact with the first conductive layer 242c of the third photoelectric element 241c. The second conductive layer 244c of the photoelectric element 241c is formed so as to come into contact with the first conductive layer of a fourth photoelectric element.

When light is incident from the organic compound film 104 side, for the first conductive layers 242a to 242c, conductive layers that can achieve ohmic contact with the photoelectric layers 243a to 243c that are formed of amorphous semiconductor films and that can transmit light are used. Typically, ITO (an alloy of indium oxide and tin oxide), an alloy of indium oxide and zinc oxide ($In_2O_3$—ZnO), zinc oxide (ZnO), indium tin oxide that contains silicon oxide, or the like can be used. Furthermore, the second conductive layers 244a to 244c are formed of a metal that can make ohmic contact with the photoelectric layers 243a to 243c that are formed of amorphous semiconductor films. As typical examples, the second conductive layers 244a to 244c are formed from one element selected from aluminum (Al), titanium (Ti), chromium (Cr), nickel (Ni), molybdenum (Mo), palladium (Pd), tantalum (Ta), tungsten (W), platinum (Pt), and gold (Au) or from an alloy material that contains one of these elements at a content of 50% or more.

On the other hand, when light is incident from the second conductive layers 244a to 244c side, a metal that can make ohmic contact with the photoelectric layers 243a to 243c that are formed of amorphous semiconductor films is used for the first conductive layers 242a to 242c, for the second conductive layers 244a to 244c, conductive layers that can achieve ohmic contact with the photoelectric layers 243a to 243c that are formed of amorphous semiconductor films and that can transmit light are used.

The photoelectric layers 243a to 243c can each be formed of a semiconductor layer that has an amorphous semiconductor film. As typical examples of this kind of semiconductor layer, an amorphous silicon layer, an amorphous silicon-germanium layer, and a silicon carbide layer and a PN junction layer and PIN junction layer of these layers can be given. In the present embodiment mode, the photoelectric layers 243a to 243c are formed of amorphous silicon that has a PIN junction.

A flexible substrate 245 may be attached to the second conductive layers 244a to 244c using an adhesive 246.

Next, a stacked-layer body 247 that includes the nonmetal inorganic film 103, the organic compound film 104, the photoelectric elements 241a to 241c, and the flexible substrate 245 is separated from the substrate 100. Because the molybdenum oxide film is brittle, separation of a stacked-layer body from a substrate can be performed with relatively little force. It is to be noted that, after the stacked-layer body 247 is separated from the substrate 100, the nonmetal inorganic film 103 may be removed, as necessary.

It is to be noted that, when a plurality of semiconductor devices is included in the stacked-layer body 247 that includes the nonmetal inorganic film 103, the organic compound film 104, the photoelectric elements 241a to 241c, and the flexible substrate 245, the stacked-layer body may be divided up and the plurality of semiconductor devices cut apart. By this kind of step, a plurality of semiconductor devices 248 can be fabricated by a single separation step.

By the above steps, a thin semiconductor device that has flexibility can be fabricated.

In addition, by combination of semiconductor devices fabricated according to the present embodiment mode, a variety of electronic devices can be fabricated. For the electronic devices, cellular phones; notebook computers; game machines; car navigation systems; portable audio devices; portable AV devices; cameras such as digital cameras, film cameras, instant cameras, and the like; room air conditioners; car air conditioners; ventilation and air conditioning systems; electric pots; CRT projection TVs; lighting devices; lighting systems; and the like can be given. Specific examples of these devices will be given below.

The photoelectric element of the present embodiment mode is made to function as a light sensor, and the light sensor can be used as a sensor for optimal adjustment of display luminance and the brightness of a backlight and for a battery saver in cellular phones, notebook computers, digital cameras, game machines, car navigation systems, portable audio devices, and the like. In addition, the photoelectric element of the present embodiment mode is made to function as a solar cell, and the solar cell can be provided in these devices as a battery. Because these semiconductor devices are small in size and a high level of integration can be achieved with these semiconductor devices, miniaturization of electronic devices can be achieved.

Moreover, the photoelectric element of the present embodiment mode is made to function as a light sensor, and the light sensor can be implemented in cellular phone key switches and portable AV devices as a sensor for ON/OFF control of a backlight LED or a cold-cathode tube or for a battery saver. By implementation of a light sensor in these devices, a switch can be turned OFF in brightly lit environments, and battery consumption due to operations of buttons for a long time can be reduced. Because the semiconductor devices of the present invention are small in size and a high level of integration can be achieved with these semiconductor devices, miniaturization and reduction of power consumption of electronic devices can be achieved.

Furthermore, the photoelectric element of the present embodiment mode is made to function as a light sensor, and the light sensor can be implemented in a camera, such as a digital camera, a film camera, an instant camera, or the like, as a sensor for flash control or aperture control. In addition, the photoelectric element of the present embodiment mode is made to function as a solar cell, and the solar cell can be provided in these devices as a battery. Because these semiconductor devices are small in size and a high level of integration can be achieved with these semiconductor devices, miniaturization of electronic devices can be achieved.

In addition, the photoelectric element of the present embodiment mode is made to function as a light sensor, and the light sensor can be implemented in a room air conditioner, a car air conditioner, or a ventilation and air conditioning system as a sensor used to control airflow and temperature.

Because the semiconductor devices of the present invention are small in size and a high level of integration can be achieved with these semiconductor devices, miniaturization of electronic devices can be achieved. Conservation of electric power can be achieved.

Furthermore, the photoelectric element of the present embodiment mode is made to function as a light sensor, and the light sensor can be implemented in an electric pot as a sensor used to control the temperature at which what is inside the electric pot is kept warm. By the light sensor of the present embodiment mode, the temperature at which at which what is inside the electric pot is kept warm can be set low after the lights in a room have been turned off. Moreover, because the light sensor is small and thin, the light sensor can be implemented in a given location, and, as a result, conservation of electric power can be achieved.

In addition, the photoelectric element of the present embodiment mode is made to function as a light sensor, and the light sensor can be implemented in a display of a CRT projection TV as a sensor used for scan line position adjustment (alignment of RGB scan lines (digital auto convergence)). Because the semiconductor devices of the present invention are small in size and a high level of integration can be achieved with these semiconductor devices, miniaturization of electronic devices can be achieved and a sensor can be implemented in a given region. Furthermore, high-speed automatic control of a CRT projection TV becomes possible.

In addition, the photoelectric element of the present embodiment mode is made to function as a light sensor, and the light sensor can be implemented in various types of household lighting equipment, outdoor lamps, streetlights, uninhabited public systems, stadiums, automobiles, calculators, and the like as a sensor used for ON/OFF control of various types of lighting devices and lighting systems. By the sensor of the present invention, conservation of electric energy can be achieved. Moreover, by the photoelectric element of the present embodiment mode being made to function as a solar cell and being provided in these electronic devices as a battery, the size of the battery can be thinned, and miniaturization of electronic devices can be achieved.

Embodiment Mode 6

Liquid crystal display devices and light-emitting devices obtained by use of the present invention can be used in a variety of modules (active matrix liquid crystal modules and active matrix EL modules). That is, the present invention can be implemented in all electronic devices in which these modules are incorporated into a display portion.

For those kinds of electronic devices, cameras such as video cameras, digital cameras, and the like; displays that can be mounted on a person's head (goggle-type displays); car navigation systems; projectors; car stereos; personal computers; portable information terminals (mobile computers, cellular phones, electronic book readers, and the like); and the like can be given. Examples of these devices are shown in FIGS. 14A to 14C.

Figure 14A:
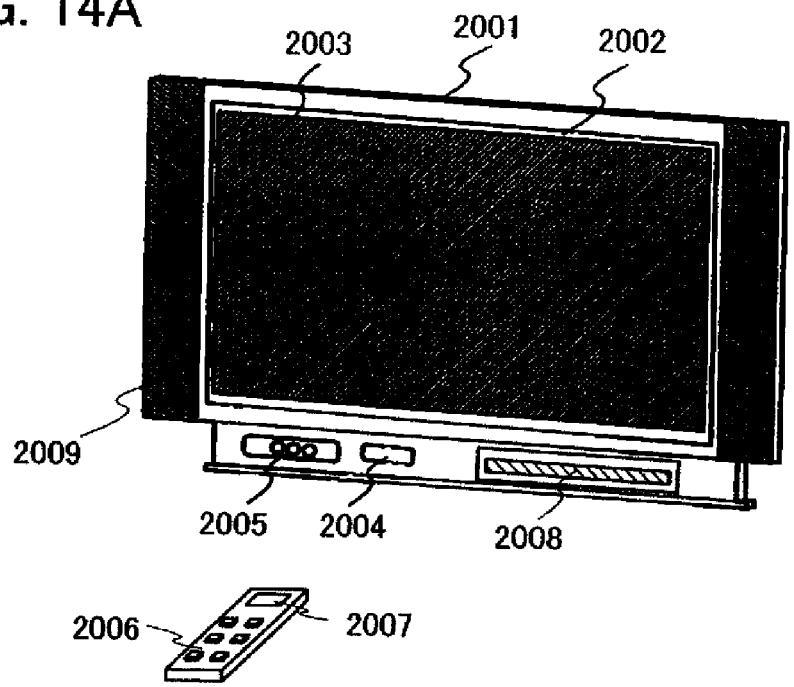
FIGS. 14A to 14C are diagrams, each illustrating an example of an electronic device.
Figure 14B:
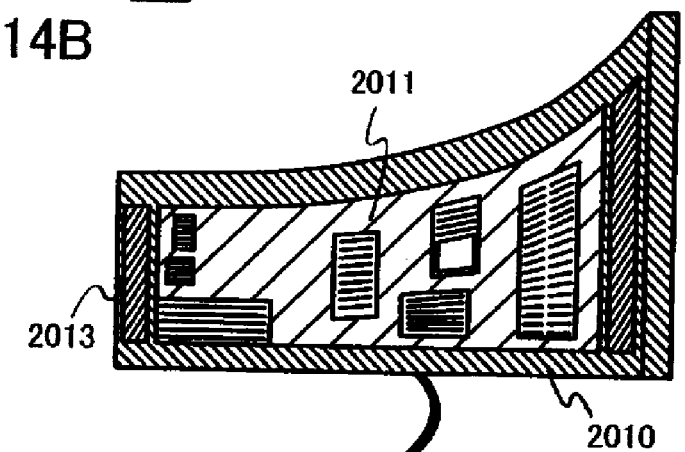
Figure 14C:
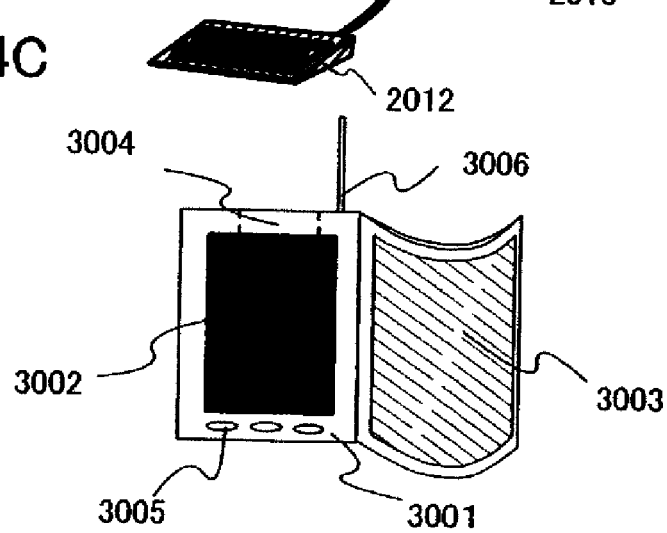

FIGS. 14A and 14B are each a diagram of a television device. With display panels, there are cases in which only a pixel portion is formed in the display panel and a scanning line side driver circuit and a signal line side driver circuit are mounted to the display panel by a TAB method; cases in which only a pixel portion is formed in the display panel and a scanning line driver circuit and a signal line driver circuit are mounted to the display panel by a COG method; cases in which a thin film transistor is formed, a pixel portion and a scanning line driver circuit are formed over the same substrate, and a signal line driver circuit is formed separately and mounted to the display panel as a driver IC; cases in which a pixel portion, a scanning line driver circuit, and a signal line driver circuit are formed over the same substrate; and the like, but any kind of mode may be used.

For structures of other external circuits, on the input side of a video signal, one structure is made up of a video signal amplifier circuit used to amplify video signals out of signals received by a tuner; a video signal processing circuit used to convert signals output from the video signal amplifier circuit into color signals corresponding to each color of red, green, and blue; a control circuit used to convert those video signals into input specifications for a driver IC; and the like. The control circuit outputs signals to both the scanning line side and the signal line side. When digital drive is used, the structure may be one in which a signal divider circuit is provided on the signal line side and an input digital signal is divided into a plurality of signals and supplied.

Of signals that are received by a tuner, audio signals are transmitted to an audio signal amplifier circuit, and the output thereof is supplied to a speaker through an audio signal processing circuit. A controller circuit receives receiving station (receiving frequency) information and information for control of volume from an input portion, and signals are sent out to the tuner and the audio signal processing circuit.

A television device can be completed by incorporation of a display module into a chassis, as shown in each of FIGS. 14A and 14B. An object including from a display panel to an FPC that is connected to the display panel is also referred to as a display module. A display module is formed of a main screen 2003 and is also equipped with speaker portions 2009, operation switches, and the like as accessory equipment. As thus described, a television device can be completed.

As shown in FIG. 14A, a display panel 2002 using display elements is incorporated into a chassis 2001, and starting with reception of general television broadcast signals by a receiver 2005, communication of information in one direction (from a transmitter to a receiver) or in two directions (between a transmitter and a receiver or between receivers) by connection to a wired or wireless communications network via a modem 2004 can be done, as well. Operations of the television device can be carried out using switches that are incorporated into the chassis or by a remote control device 2006 provided separately, and a display portion 2007 that displays information output to this remote control device may be provided in the remote control device, as well.

Furthermore, in a television device, a structure, in which a subscreen 2008, used to display channel number, volume, and the like and formed using a second display panel in addition to the main screen 2003, may be added, as well. In this structure, the main screen 2003 may be formed of an EL display panel that has an excellent viewing angle, and the subscreen may be formed of a liquid crystal display panel by which display at low power consumption is possible. In addition, in order to give priority to a shift toward lower power consumption, the structure may be set to be one in which the main screen 2003 is formed of a liquid crystal display panel, the subscreen is formed of an EL display panel, and the subscreen can be set to be turned on or off.

FIG. 14B is a diagram of a television device that has a large display portion, for example, one that has a 20-inch to 80-inch display screen, and includes a chassis 2010, a keyboard 2012 used for operations, a display portion 2011, speaker portions 2013, and the like. The present invention is applied to fabrication of the display portion 2011. In the display portion of FIG. 14B, because a flexible substrate that can be curved is used, the television device comes to be a curved television device. Because the shape of this kind of display device can be designed freely, a television device that has a desired shape can be manufactured.

By the present invention, because display devices can be formed by a simplified process, a reduction in costs can be achieved. Consequently, with a television device formed using the present invention, even a television device with a large display screen can be formed at low cost.

Needless to say, the present invention is not limited to being used in television devices, and starting with monitors for personal computers, the present invention can be applied to a variety of applications, such as information display boards in railway stations, airports, and the like; street-side advertisement display boards; and the like, as display media that have a large area.

In addition, FIG. 14C is a diagram of a portable information terminal (electronic book reader) and includes a main body 3001, display portions 3002 and 3003, a storage medium 3004, operation switches 3005, an antenna 3006, and the like. The separation method of the present invention can be applied to the display portions 3002 and 3003. By use of a flexible substrate, making the portable information terminal thinner and more lightweight can be achieved.

The present embodiment mode can be freely combined with any one of Embodiment Mode 1 through Embodiment Mode 3.

Embodiment Mode 7

In the present embodiment mode, an example in which an electrophoretic display device is used for the display described in Embodiment Mode 6 will be described. Typically, the electrophoretic display device applies to the display portion 3002 or the display portion 3003 of a portable information terminal (electronic book reader) that is shown in FIG. 14C.

The electrophoretic display device (electrophoretic display) is also referred to as electronic paper and has advantages in that it has the same level of readability as regular paper, it has less power consumption than other display devices, and it can be set to have a thin, light form.

With the electrophoretic display, various modes can be considered; however, electrophoretic displays are displays, which contain a plurality of microcapsules that each contains first particles that have positive charge, second particles that have negative charge, and a solvent and in which the particles within the microcapsules are moved in opposite directions from each other by application of an electric field to the microcapsules and only the color of particles concentrated on one side is displayed. It is to be noted that the first particles and the second particles each have a pigment and are particles that do not move unless in the presence of an electric field. Moreover, the colors of the first particles and the second particles are set to be different (this includes particles that are colorless).

In this way, an electrophoretic display is a display that uses the so-called dielectrophoretic effect by which first particles or second particles that have a high dielectric constant move to a region in which there is a high electric field. With an electrophoretic display, there is no need to use a polarizer or a counter substrate, which are required in a liquid crystal display device, and both the thickness and weight of the electrophoretic display device can be cut in half.

A substance in which the aforementioned microcapsules are diffused throughout a solvent is referred to as electronic ink. This electronic ink can be printed over the surface of glass, plastic, cloth, paper, and the like. Furthermore, by use of a color filter or particles that have a pigment, color display is possible, as well.

In addition, if a plurality of the aforementioned microcapsules are arranged, as appropriate, over a substrate so as to be interposed between a pair of electrodes, a display device can be completed, and display can be performed with application of an electric field to the microcapsules. For example, the active matrix substrate obtained with Embodiment Mode 1 or Embodiment Mode 2 can be used. Although electronic ink can be printed directly onto a plastic substrate, when the display device is an active matrix type of device, it is preferable that elements and electronic ink be formed over a glass substrate, rather than elements being formed over a plastic substrate that is easily affected by heat and degraded by organic solvents, and separated from the glass substrate according to the separation method of Embodiment Mode 1 or Embodiment Mode 2.

It is to be noted that the first particles and the second particles in the microcapsules may each be formed of a single type of material selected from a conductive material, an insulating material, a semiconductor material, a magnetic material, a liquid crystal material, a ferroelectric material, an electroluminescent material, an electrochromic material, and a magnetophoretic material or formed of a composite material of any of these.

The present embodiment mode can be freely combined with any one of Embodiment Mode 1, Embodiment Mode 2, or Embodiment Mode 6.

Embodiment 1

In the present embodiment, changes in the current-voltage characteristics of a thin film transistor, which is one example of a semiconductor element, observed before and after performance of the separation process of the present invention, are shown.

A manufacturing process of a thin film transistor of the present embodiment will be given using FIGS. 16A to 16F.

Figure 16A:
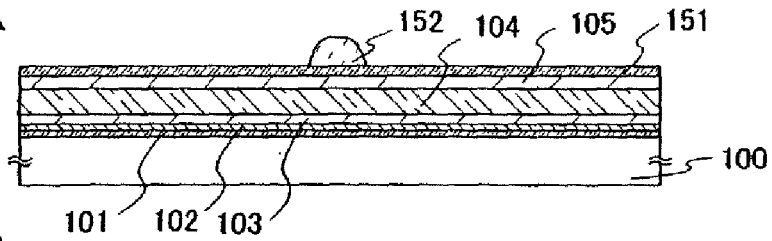
FIGS. 16A to 16F are cross-sectional-view diagrams used to describe a manufacturing method for a semiconductor device of the present invention.

As shown in FIG. 16A, the molybdenum film 101 is formed over the substrate 100, the molybdenum oxide film 102 is formed over the molybdenum film 101, the nonmetal inorganic film 103 is formed over the molybdenum oxide film 102, the organic compound film 104 is formed over the nonmetal inorganic film 103, the inorganic insulating film 105 is formed over the organic compound film 104, and a first conductive film 151 is formed over the inorganic insulating film 105.

Here, a glass substrate manufactured by Corning Incorporated was used for the substrate 100.

Furthermore, for the molybdenum film 101, a molybdenum film was formed at a thickness of 50 nm by a sputtering method. Here, a molybdenum target was used, an argon gas with a flow rate of 30 sccm was used for a sputtering gas, the pressure of the reaction chamber that was used was set to 0.4 Pa, and the power of the power supply that was used was set to 1.5 kW.

In addition, the chamber of a plasma CVD device was filled with an $N_2O$ gas, a plasma was generated, and the surface of the molybdenum film 101 was oxidized to form the molybdenum oxide film 102.

Moreover, for the nonmetal inorganic film 103, a silicon oxynitride film was formed at a thickness of 100 nm by a plasma CVD method. Here, $SiH_4$ with a flow rate of 100 sccm and $N_2O$ with a flow rate of 1000 sccm were used as source gases, the pressure of the reaction chamber that was used was set to 80 Pa, the power of the power supply that was used was set to 300 kW, and the temperature for film formation was set to 280° C. It is to be noted that the power supply frequency was 13.56 MHz, the distance between electrodes was 24.5 mm, and the size of the electrodes was 60.3 cm×49.3 cm=2972.8 cm².

In addition, for the organic compound film 104, polyimide was formed at a thickness of 15 μm by application of a composition by a spin coating method, heating of the composition at a temperature of 80° C. for 5 minutes, and heating at a temperature of 300° C. for 30 minutes.

Furthermore, for the inorganic insulating film 105, by a plasma CVD method, a silicon nitride oxide film was formed at a thickness of 50 nm, and after that, a silicon oxynitride film was formed at a thickness of 100 nm. Here, $SiH_4$ with a flow rate of 15 sccm, $H_2$ with a flow rate of 1200 sccm, $NH_3$ with a flow rate of 150 sccm, and $N_2O$ with a flow rate of 20 sccm were used as source gases; the pressure of the reaction chamber that was used was set to 40 Pa; the power of the power supply that was used was set to 250 kW; and the temperature for film formation was set to 280° C. It is to be noted that the power supply frequency was 13.56 MHz, the distance between electrodes was 24.5 mm, and the size of the electrodes was 60.3 cm×49.3 cm=2972.8 cm².

For the first conductive film 151, a molybdenum film was formed at a thickness of 100 nm, under the same conditions by which the molybdenum film 101 was formed.

Next, after surface modifying treatment was performed on the first conductive film 151, a film (not shown in the diagram) that repels liquids was formed and irradiated with UV light, and after that, a first mask 152 was formed.

Here, because a film that repels liquids had not been formed on the surface of the first conductive film 151, the surface of the first conductive film 151 was treated with hydrogen peroxide for a short amount of time, and surface modifying treatment was performed on the first conductive film 151. Furthermore, the film that repels liquids was formed in order to control the shape of the first mask 152. With the surface tension of the surface of the film that repels liquids being high, the wettability of the surface of the film that repels liquids by a composition extruded over is low, and because there was a risk that the first mask would be segmented and not form into the shape desired, the film that repels liquids was irradiated with UV light, and the surface tension of the film that repels liquids was controlled. Here, heptadecafluorodecyltrimethoxysilane was deposited at 170° C. for 10 minutes, and a film that repels liquids was formed by adsorption of the heptadecafluorodecyltrimethoxysilane by the surface of the first conductive film.

The first mask 152 was formed of a novolac resin where a composition was discharged by an inkjet printing method and heated at 120° C. for 3 minutes.

Figure 16B:
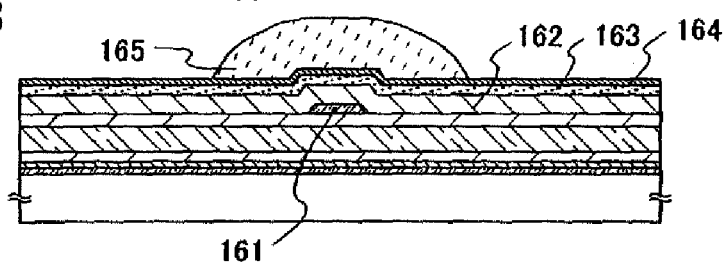

Next, parts of the first conductive film 151 that are not covered by the first mask 152 were etched, and a gate electrode 161 shown in FIG. 16B was formed. After formation of the gate electrode 161, the first mask 152 was removed.

Here, the first conductive film 151 was etched by dry etching with $CF_4$ with a flow rate of 50 sccm and $O_2$ with a flow rate of 45 sccm used as etching gases, the pressure of the reaction chamber that was used set to 13.33 Pa, and the power of the power supply that was used set to 500 W.

Next, a gate insulating film 162 was formed over the inorganic insulating film 105 and the gate electrode 161, an amorphous semiconductor film 163 was formed over the gate insulating film 162, and an n-type semiconductor film 164 was formed over the amorphous semiconductor film 163.

For the gate insulating film 162, a silicon nitride film was formed at a thickness of 300 nm by a plasma CVD method. For the amorphous semiconductor film 163, an amorphous silicon film was formed at a thickness of 150 nm by a plasma CVD method. For the n-type semiconductor film 164, an n-type amorphous silicon film was formed at a thickness of 50 nm by a plasma CVD method.

Here, for film formation conditions for the silicon nitride film that was formed for the gate insulating film 162, $SiH_4$ with a flow rate of 40 sccm, $H_2$ with a flow rate of 500 sccm, $NH_3$ with a flow rate of 550 sccm, and $N_2O$ with a flow rate of 140 sccm were used as source gases; the pressure of the reaction chamber that was used was set to 100 Pa; and the power of the power supply that was used was set to 370 kW. Furthermore, for film formation conditions for the amorphous silicon film that was formed for the amorphous semiconductor film 163, $SiH_4$ with a flow rate of 280 sccm and $H_2$ with a flow rate of 300 sccm were used as source gases, the pressure of the reaction chamber that was used was set to 170 Pa; and the power of the power supply that was used was set to 60 kW. In addition, for film formation conditions for the n-type amorphous silicon film that was formed for the n-type semiconductor film 164, $SiH_4$ with a flow rate of 100 sccm and 0.5% $PH_3$ (hydrogen dilution) with a flow rate of 170 sccm were used as source gases, the pressure of the reaction chamber that was used was set to 170 Pa; and the power of the power supply that was used was set to 60 kW. It is to be noted that, for film formation of these films, the temperature for film formation was set to 280° C., the power supply frequency was 13.56 MHz, the distance between electrodes was 24.5 mm, and the size of the electrodes was 60.3 cm×49.3 cm=2972.8 cm².

Next, after a film (not shown in the diagram) that repels liquids was formed over the surface of the n-type semiconductor film 164, a second mask 165 was formed. It is to be noted that surface modifying treatment for the n-type semiconductor film 164, formation of the film that repels liquids, and irradiation of the film that repels liquids with UV light are the same as those used for formation pretreatment on the first conductive film 151 before the first mask 152 is formed.

The second mask 165 was formed of a novolac resin where a composition was discharged by an inkjet printing method and heated at 120° C. for 3 minutes.

Figure 16C:
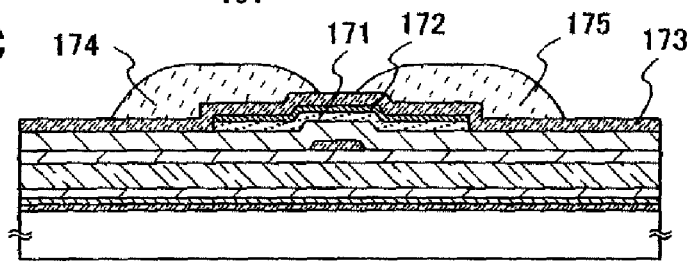

Next, the n-type semiconductor film 164 was etched using the second mask 165, and an n-type semiconductor layer 172 that is shown in FIG. 16C was formed. The amorphous semiconductor film 163 was etched using the second mask 165, and an amorphous semiconductor layer 171 was formed.

Here, the amorphous semiconductor film 163 and the n-type semiconductor film 164 were etched by dry etching with $Cl_2$ with a flow rate of 60 sccm and $CF_4$ with a flow rate of 10 sccm used as etching gases, the pressure of the reaction chamber that was used set to 13.3 Pa, and the power of the power supply that was used set to 750 W. After dry etching was performed, the second mask 165 was removed.

Next, a third mask that is not shown in the diagram was formed over the gate insulating film 162, part of the gate insulating film 162 was etched, and a contact hole exposing part of the gate electrode 161 was formed. After the contact hole was formed, the third mask was removed.

Here, the gate insulating film 162 was etched by dry etching with $CHF_3$ with a flow rate of 35 sccm used as an etching gas, the pressure of the reaction chamber that was used set to 3.33 Pa, and the power of the power supply that was used set to 1000 W.

Next, a second conductive film 173 was formed over exposed parts of the gate electrode 161, the gate insulating film 162, the amorphous semiconductor layer 171, and the n-type semiconductor layer 172. Then, although not shown in the diagram, after surface modifying treatment was performed on the second conductive film 173, a film that repels liquids was formed. After the surface of the film that repels liquids was irradiated with UV light, fourth masks 174 and 175 were formed. It is to be noted that surface modifying treatment for the second conductive film 173, formation of the film that repels liquids, and irradiation of the film that repels liquids with UV light are the same as those used for formation pretreatment on the first conductive film 151 before the first mask 152 is formed.

Here, for the second conductive film 173, a molybdenum film was formed at a thickness of 200 nm by the same conditions as were used in formation of the first conductive film 151. Furthermore, the fourth masks 174 and 175 were formed of a novolac resin by the same conditions as were used in formation of the first mask 152.

Figure 16D:
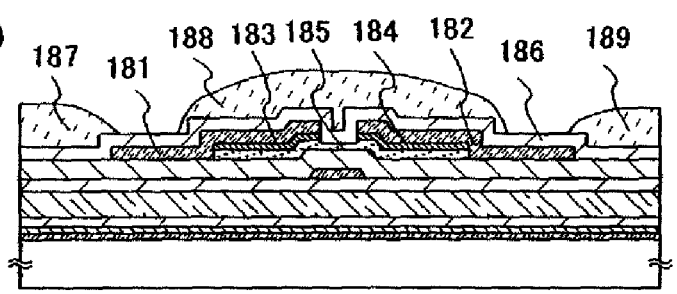
Figure 16E:
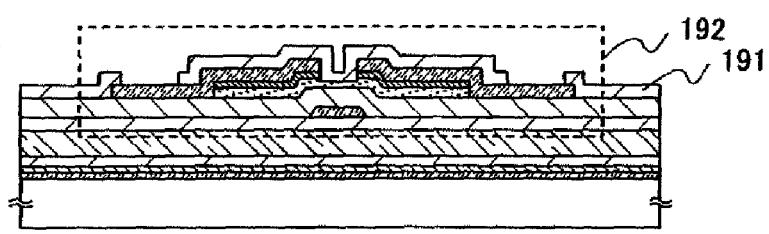

Next, the second conductive film 173 was etched using the fourth masks 174 and 175, and a source electrode and a drain electrode 181 and 182 shown in FIG. 16D were formed. In addition, although not shown in the diagram, a connecting wiring connected to the gate electrode 161 was formed.

Here, the second conductive film 173 was etched by wet etching using a mixed solution of phosphoric acid, acetic acid, and nitric acid. After the second conductive film 173 was etched, the fourth masks 174 and 175 were removed.

Next, the n-type semiconductor layer 172 was etched using the source electrode and drain electrode 181 and 182 as masks, and a source region and a drain region 183 and 184 were formed. At this time, the amorphous semiconductor layer 171 was also etched somewhat. The amorphous semiconductor layer at this time is defined as an amorphous semiconductor layer 185.

Next, a third insulating film 186 was formed over exposed parts of the gate insulating film 162, the source electrode and drain electrode 181 and 182, and the amorphous semiconductor layer 185. The third insulating film 186 functions as a passivation film.

Here, for the third insulating film 186, a silicon nitride film was formed at a thickness of 200 nm by the same conditions as were used in formation of the gate insulating film 162.

Next, after fifth masks 187 to 189 were formed over the third insulating film 186, the third insulating film 186 was etched, and along with an insulating layer 191 being formed, parts of each of the source electrode and drain electrode 181 and 182 and the connecting wiring connected to the gate electrode were exposed. Measurements of current-voltage characteristics of a thin film transistor fabricated by the steps given above can be taken. After the third insulating film 186 was etched, the fifth masks 187 to 189 were removed.

Here, by conditions that were the same as those used when the contact hole was formed in the gate insulating film, the third insulating film 186 was etched by dry etching.

Next, heat treatment was performed to improve the current-voltage characteristics of a thin film transistor. Here, heating was performed at 250° C. for 12 minutes. Off current ($I_{off}$) can be reduced with this heating step. By the above steps, a thin film transistor 192 was fabricated.

Figure 17A:
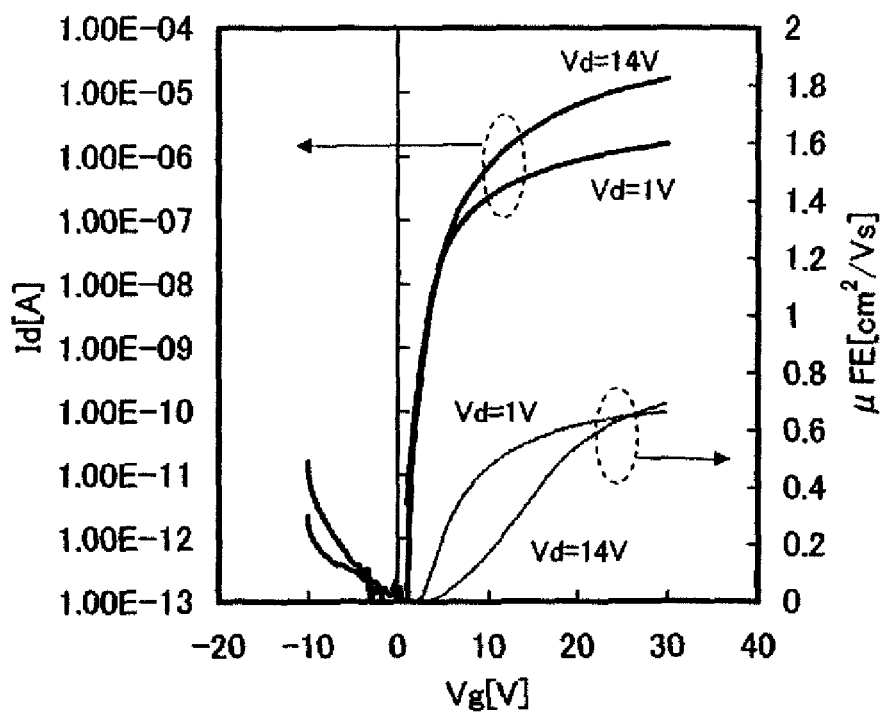
FIGS. 17A and 17B are diagrams, each used to describe current-voltage characteristics of a thin film transistor that was fabricated using the present invention.

Here, current-voltage characteristics of the thin film transistor 192 were measured. These measurement results are shown in FIG. 17A.

Figure 16F:
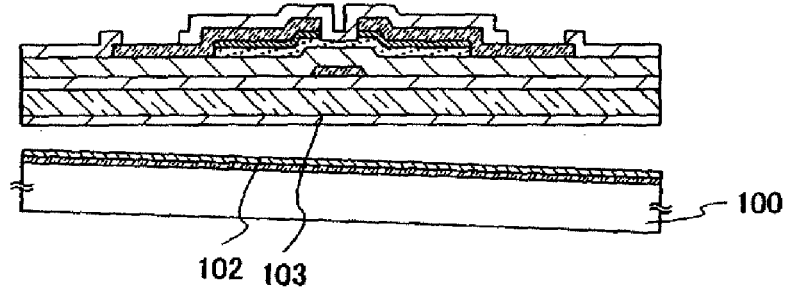

Next, after reinforcing tape was attached to an edge of a substrate and incisions were inserted from the tape side to the substrate 100, as shown in FIG. 16F, the nonmetal inorganic film 103 was separated from the substrate 100. Here, a diagram in which disjointing occurred at the molybdenum oxide film 102 and the nonmetal inorganic film 103 was separated from the substrate 100 is shown.

Figure 17B:
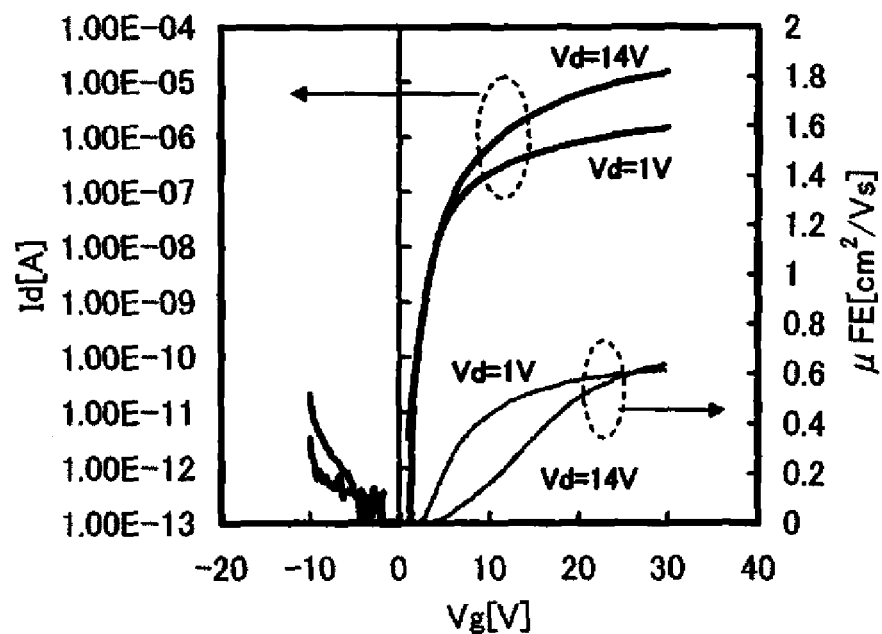

Next, results for measurements of current-voltage characteristics of the thin film transistor 192 that was separated from the substrate 100 are shown in FIG. 17B. In addition, the measurement results of FIGS. 17A and 17B are given in Table 1. It is to be noted that the channel length of the thin film transistor that was measured was 50 μm and the channel width was 170 μm.

TABLE 1

|  | Before separation | After separation |
| --- | --- | --- |
| Subthreshold swing (V/dec) | 0.59 | 0.56 |
| $V_{th}$ (V) | 5.39 | 5.28 |
| μFE (cm²/(V · s)) | 0.66 | 0.61 |
| On/off ratio ($V_d = 1$ V) | $7.54 \times 10^5$ | $6.50 \times 10^5$ |
| On/off ratio ($V_d = 14$ V) | $1.72 \times 10^6$ | $1.97 \times 10^6$ |

From FIGS. 17A and 17B, it can be seen that there is almost no change in the current-voltage characteristics and mobility of the thin film transistor from before and after separation.

From what is described above, it can be seen that a semiconductor device that is flexible can be fabricated while degradation of characteristics of a thin film transistor formed over a substrate is avoided.

This application is based on Japanese Patent Application serial no. 2007-023747 filed with the Japan Patent Office on Feb. 2, 2007, the entire contents of which are hereby incorporated by reference.

What is claimed is:

1. A method of manufacturing a semiconductor device, comprising the steps of:
    forming a metal film over a substrate;
    forming a metal oxide film over the metal film;
    forming a nonmetal inorganic film over the metal oxide film;
    forming an organic compound film over the nonmetal inorganic film;
    forming a thin film transistor comprising a gate electrode, a gate insulating film and a semiconductor film over the organic compound film;
    forming an interlayer insulating film over the thin film transistor; and
    separating the thin film transistor from the substrate.

2. The method of manufacturing a semiconductor device according to claim 1, wherein the metal oxide film comprises an oxide of a same metal as a metal of the metal film.

3. The method of manufacturing a semiconductor device according to claim 1, wherein the organic compound film is formed at a thickness of 5 μm or more.

4. A method of manufacturing a semiconductor device, comprising the steps of:
    forming a molybdenum film over a substrate;
    forming a molybdenum oxide film over the molybdenum film;
    forming a nonmetal inorganic film over the molybdenum oxide film;
    forming an organic compound film over the nonmetal inorganic film;
    forming a thin film transistor comprising a gate electrode, a gate insulting film and an amorphous semiconductor film over the organic compound film;
    forming an interlayer insulating film over the thin film transistor; and
    separating a stacked-layer body including the nonmetal inorganic film, the organic compound film, and the thin film transistor from the substrate.

5. The method of manufacturing a semiconductor device according to claim 4, wherein the organic compound film is formed by heating at a temperature greater than or equal to 180° C. and less than 500° C.

6. The method of manufacturing a semiconductor device according to claim 4, further comprising the step of performing partial irradiation with a laser beam before separating the stacked-layer body from the substrate.

7. The method of manufacturing a semiconductor device according to claim 4, wherein the substrate is selected from the group consisting of a glass substrate, a ceramic substrate, and a quartz substrate.

8. The method of manufacturing a semiconductor device according to claim 4, wherein the molybdenum oxide film is formed in contact with the molybdenum film.

9. The method of manufacturing a semiconductor device according to claim 4, wherein the organic compound film is formed at a thickness of 5 μM or more.

10. A method of manufacturing a semiconductor device, comprising the steps of:
    forming a molybdenum film over a substrate;
    forming a molybdenum oxide film over the molybdenum film;
    forming a nonmetal inorganic film over the molybdenum oxide film;
    forming an organic compound film over the nonmetal inorganic film;
    forming a thin film transistor comprising a gate electrode, a gate insulating film and a semiconductor film that contains an organic compound over the organic compound film;
    forming an interlayer insulating film over the thin film transistor; and
    separating a stacked-layer body including the nonmetal inorganic film, the organic compound film, and the thin film transistor from the substrate.

11. The method of manufacturing a semiconductor device according to claim 10, wherein the organic compound film is formed by heating at a temperature greater than or equal to 180° C. and less than 500° C.

12. The method of manufacturing a semiconductor device according to claim 10, further comprising the step of performing partial irradiation with a laser beam before separating the stacked-layer body from the substrate.

13. The method of manufacturing a semiconductor device according to claim 10, wherein the substrate is selected from the group consisting of a glass substrate, a ceramic substrate, and a quartz substrate.

14. The method of manufacturing a semiconductor device according to claim 10, wherein the molybdenum oxide film is formed in contact with the molybdenum film.

15. The method of manufacturing a semiconductor device according to claim 10, wherein the organic compound film is formed at a thickness of 5 μm or more.

16. A method of manufacturing a semiconductor device, comprising the steps of:
    forming a molybdenum film over a substrate;
    forming a molybdenum oxide film over the molybdenum film;
    forming a nonmetal inorganic film over the molybdenum oxide film;
    forming an organic compound film over the nonmetal inorganic film;
    forming a thin film transistor comprising a gate electrode, a gate insulating film and a semiconductor film over the organic compound film;
    forming an interlayer insulating film over the thin film transistor;
    forming a first electrode over the interlayer insulating film;
    forming a light-emitting layer over the first electrode;
    forming a second electrode over the light-emitting layer;
    affixing a flexible substrate over the second electrode; and
    separating a stacked-layer body including the nonmetal inorganic film, the organic compound film, the thin film transistor, the interlayer insulating film, the first electrode, the light-emitting layer, the second electrode, and the flexible substrate from the substrate.

17. The method of manufacturing a semiconductor device according to claim 16, wherein the organic compound film is formed by heating at a temperature greater than or equal to 180° C. and less than 500° C.

18. The method of manufacturing a semiconductor device according to claim 16, further comprising the step of performing partial irradiation with a laser beam before separating the stacked-layer body from the substrate.

19. The method of manufacturing a semiconductor device according to claim 16, wherein the substrate is selected from the group consisting of a glass substrate, a ceramic substrate, and a quartz substrate.

20. The method of manufacturing a semiconductor device according to claim 16, wherein the organic compound film is formed at a thickness of 5 μm or more.

21. The method of manufacturing a semiconductor device according to claim 16, wherein the molybdenum oxide film is formed in contact with the molybdenum film.

22. A method of manufacturing a semiconductor device, comprising the steps of:
    forming a metal film over a substrate;
    forming a metal oxide film over the metal film;
    forming a nonmetal inorganic film in contact with the metal oxide film;
    forming an organic compound film in contact with the nonmetal inorganic film;
    forming a thin film transistor comprising a gate electrode, a gate insulating film and a semiconductor film over the organic compound film;
    forming an interlayer insulating film over the thin film transistor; and
    separating the thin film transistor from the substrate.

23. The method of manufacturing a semiconductor device according to claim 22, wherein the metal oxide film comprises an oxide of a same metal as a metal of the metal film.

24. The method of manufacturing a semiconductor device according to claim 22, wherein the organic compound film is formed by heating at a temperature greater than or equal to 180° C. and less than 500° C.

25. The method of manufacturing a semiconductor device according to claim 22, further comprising the step of performing partial irradiation with a laser beam before separating the thin film transistor from the substrate.

26. The method of manufacturing a semiconductor device according to claim 22, wherein the substrate is selected from the group consisting of a glass substrate, a ceramic substrate, and a quartz substrate.

27. The method of manufacturing a semiconductor device according to claim 22, wherein the metal film is a molybdenum film.

28. The method of manufacturing a semiconductor device according to claim 22, wherein the organic compound film is formed at a thickness of 5 μm or more.

* * * * *